United States Patent
Ono et al.

(10) Patent No.: US 9,673,263 B2
(45) Date of Patent: Jun. 6, 2017

(54) COLOR FILTER FORMING SUBSTRATE AND ORGANIC EL DISPLAY DEVICE

(71) Applicant: DAI NIPPON PRINTING CO., LTD., Tokyo-to (JP)

(72) Inventors: Atsushi Ono, Tokyo-to (JP); Hiroki Sakata, Tokyo-to (JP); Yousuke Wada, Tokyo-to (JP); Masatoshi Oba, Tokyo-to (JP); Seiji Tawaraya, Tokyo-to (JP); Tadashi Furukawa, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 97 days.

(21) Appl. No.: 14/758,047

(22) PCT Filed: Dec. 10, 2013

(86) PCT No.: PCT/JP2013/083117
§ 371 (c)(1),
(2) Date: Jun. 26, 2015

(87) PCT Pub. No.: WO2014/103708
PCT Pub. Date: Jul. 3, 2014

(65) Prior Publication Data
US 2015/0349030 A1    Dec. 3, 2015

(30) Foreign Application Priority Data

Dec. 27, 2012  (JP) .................................. 2012-284636
Dec. 3, 2013   (JP) .................................. 2013-250135

(51) Int. Cl.
H01L 27/32      (2006.01)
H01L 51/52      (2006.01)
(Continued)

(52) U.S. Cl.
CPC ............ *H01L 27/322* (2013.01); *G02B 5/003* (2013.01); *G02B 5/201* (2013.01);
(Continued)

(58) Field of Classification Search
None
See application file for complete search history.

(56) References Cited

U.S. PATENT DOCUMENTS

2006/0043888 A1    3/2006  Nakagawa et al.
2008/0138657 A1    6/2008  Lee et al.
(Continued)

FOREIGN PATENT DOCUMENTS

CN    101197390 A    6/2008
JP    2001-126862 A  5/2001
(Continued)

OTHER PUBLICATIONS

International Search Report mailed Mar. 18, 2014; PCT/JP2013/083117.

*Primary Examiner* — Ashok Patel
(74) *Attorney, Agent, or Firm* — Ladas & Parry LLP

(57) ABSTRACT

Provided is an organic EL display device capable of preventing or restraining color shift or color mixing in an image displayed in each of its pixels, this inconvenience being caused by the entry of light into the pixel from an organic EL element of a pixel adjacent to the pixel; and provided is a color filter forming substrate making it possible to produce such an organic EL display device. The color filter forming substrate is a substrate for an organic EL display device, in which: a pixel-dividing light-shielding region is arranged over one surface of a base material comprising a transparent substrate to make plural pixel regions into a region-divided form; and plural color-filter-forming coloring layers for multiple colors are arranged to the predetermined pixel
(Continued)

regions in accordance with the respective colors, characterized in that a light-shielding layer is arranged in the pixel-dividing light-shielding region, and a surface of the light-shielding layer farthest from the one surface of the base material is positioned farther from the one surface of the base material than respective surfaces of the color-filter-forming coloring layers in the respective colors, these surfaces not being respective base material side surfaces of the coloring layers, are positioned.

8 Claims, 13 Drawing Sheets

(51) Int. Cl.
*G02B 5/20* (2006.01)
*G02B 5/00* (2006.01)

(52) U.S. Cl.
CPC ...... *H01L 27/3272* (2013.01); *H01L 51/5253* (2013.01); *H01L 51/5284* (2013.01)

(56) References Cited

U.S. PATENT DOCUMENTS

| 2009/0236976 | A1* | 9/2009 | Lee ..................... H01L 51/5284 313/504 |
| 2013/0105773 | A1* | 5/2013 | Kim ..................... H01L 51/0024 257/40 |
| 2013/0258258 | A1* | 10/2013 | Nakamura ............. G02B 5/201 349/106 |
| 2015/0153614 | A1* | 6/2015 | Qi ..................... G02F 1/133516 359/890 |

FOREIGN PATENT DOCUMENTS

| JP | 2003-243153 A | 8/2003 |
| JP | 2005-293946 A | 10/2005 |
| JP | 2005-294057 A | 10/2005 |
| JP | 2006-073219 A | 3/2006 |
| JP | 2007-220395 A | 8/2007 |
| JP | 2007-280718 A | 10/2007 |
| JP | 2008-147161 A | 6/2008 |
| JP | 2009-104969 A | 5/2009 |
| JP | 2012-185992 A | 9/2012 |
| JP | 2014-032372 A | 2/2014 |

\* cited by examiner

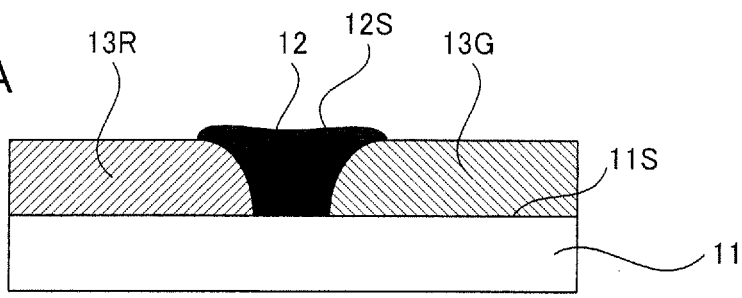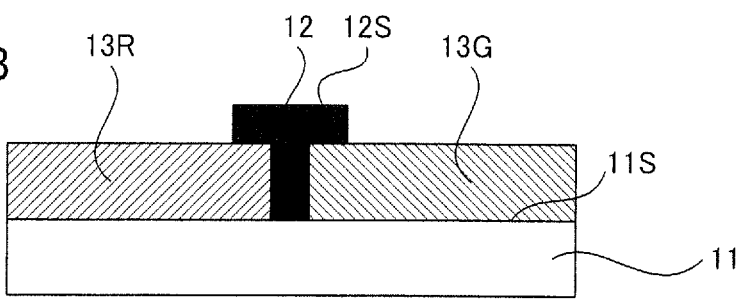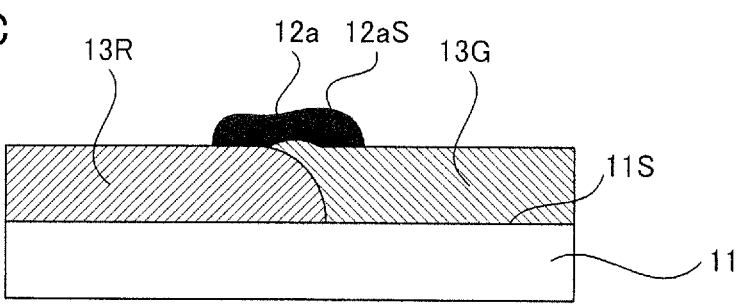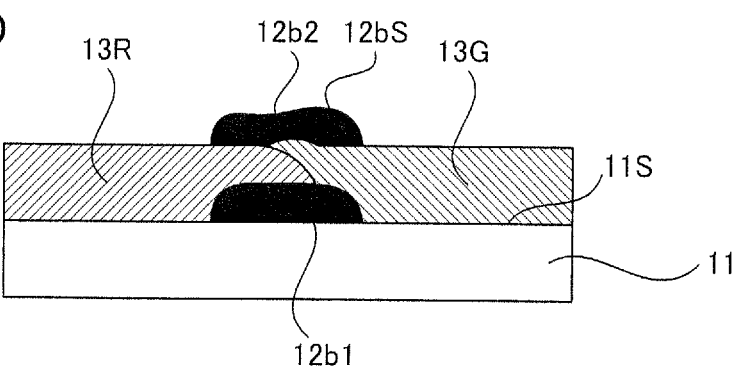

COLOR FILTER FORMING SUBSTRATE AND ORGANIC EL DISPLAY DEVICE

TECHNICAL FIELD

The present invention relates to a color filter forming substrate for an organic EL display device, and an organic EL display device using this substrate; and in particular to a color filter forming substrate for an organic EL display device of a white-light-emitting type or a different-color-separately-painted type.

BACKGROUND ART

Organic EL display devices are of a self light emitting type to be excellent in visibility, and are required to have no backlight to be capable of being made thin and light. Moreover, the display devices have a simple structure so that the display devices can be expected to be decreased in costs, and are also suitable for displaying moving images. In recent years, therefore, researches and developments about the display devices, and the commercialization thereof have been advanced as flat display devices (also referred to as flat panels) that follow liquid crystal display devices and plasma display devices.

The manner for attaining the full-color-display of organic EL display devices are roughly classified to a color filter manner, a different-color-separately-painted manner, and a color conversion manner. The color filter manner is a manner of combining a white-light-emitting organic EL element with a color filter, and the different-color-separately-painted manner is a manner of arranging respective light emitting layers in multiple colors such as red, green and blue into a planar form. The color conversion manner is a manner of combining an organic EL element that emits blue light with a color conversion layer. In the different-color-separately-painted manner, a color filter may be used together to heighten the purities of colors.

As illustrated in FIG. 11A, an organic EL display device of a white-light-emitting type in which organic EL elements (also referred to as organic light emitting elements or organic EL light emitting elements) 122 that emit white light are used is usually in a form of having not only pixels (also referred to as colored pixels) in which color-filter-forming coloring layers 113R, 113G and 113B having R, G and B colors, respectively, are arranged but also highly light-transmitting pixels high in light transmission property (white pixels in which a white layer 113W is arranged).

As illustrated in FIG. 11B, the display device may be in a form of arranging a circularly polarizing plate 130 onto on the front surface (observer side) of the white-light-emitting type organic EL display device to decrease the reflection of incident light rays from the outside.

Alternatively, as illustrated in FIG. 11C, the display device may be in a form of arranging a layer made of a light sensitive resin in which a colorant is dispersed in regions corresponding to the white pixels, and using this layer as transmittance adjusting portions 113WA to adjust the incidence of external light, and the reflection of the incident-made external light onto electrodes and metal wirings that the organic EL elements have (see Patent Literature 2).

Incidentally, reference signs or numbers in FIGS. 11A to 11C will be described in "Reference Signs List" that will be shown later.

In the case of the organic EL display device illustrated in FIG. 11A, the reflectivity of external light made incident from the front surface (observer side) is usually about 97%.

In the case of the organic EL display device illustrated in FIG. 11B, the reflectivity of external light made incident from the front surface (observer side) is usually about 0.1%. The display brightness thereof is about 40% of that of the organic EL display device in the form illustrated in FIG. 11A.

In the case of the organic EL display device in FIG. 11C, the transmittance adjusting portions 113WA make it possible to adjust the incidence of external light, and the reflection of the incident-made external light onto electrodes and metal wirings that the organic EL elements have. However, the reflection of the external light is insufficiently decreased, and unevenness in the reflection is easily viewed.

Usually, in the highly light-transmitting pixels, an uncolored resin layer is arranged, or a resin layer slightly colored to be matched with a color obtained by combining R, G and B colors with each other is arranged. Such highly light-transmitting pixels are referred to as white pixels, and the resin layer arranged in the white pixels is referred to as a white layer 113W.

Any organic EL display device may be referred to as an organic electroluminescence display unit or organic EL displaying device, and any display device may be referred to as a display panel.

As described above, white-light-emitting type organic EL display devices, in which white-light-emitting organic EL elements are used, are in various forms. In any one of the forms, a white-light-emitting organic EL element is arranged correspondingly to each of its pixels, and the pixel is controlled and driven through a TFT element. However, in any of the forms, at the time of paying attention to some pixel region of its pixel regions, white light from an organic EL element for displaying a pixel adjacent to the pixel region directly enters the coloring layer of the pixel region, or white light from an organic EL element for displaying a pixel adjacent to the pixel region passes through a color-filter-forming coloring layer of this adjacent pixel to enter the coloring layer of the pixel region. This matter causes color shift or color mixing in an image displayed (in the pixel region) in accordance with the direction in which the image is viewed.

This is caused since entire light rays from the organic EL elements are not radiated into the color filter forming substrate along a direction perpendicular to the plane of its substrate, so that the rays are radiated thereinto to have broad incident angles.

When white light from the organic EL element for displaying some pixel of the pixels passes through the color-filter-forming coloring layer of the pixel to enter the coloring layer of a pixel adjacent to the pixel, almost the entire white light is absorbed (in these pixels) in accordance with the respective light transmission properties of the two coloring layers in the visible light band. Thus, in particular, the matter that the white light from the organic EL element for displaying the (image-displayed) pixel directly enters into the coloring layer of the pixel adjacent thereto largely affects color shift or color mixing of the displayed image.

Also in a different-color-separately-painted type organic EL display device, which has organic EL elements in which respective light emitting layers in multiple colors such as red, green and blue are arranged in a planar form, at the time of using a color filter together therewith, color shift or color mixing is generated in an image displayed therein in the same manner as in the above-mentioned white-light-emitting type organic EL display device.

FIG. 15 is a graph showing an example of the following: emission spectra of an organic EL element in which respective light emitting layers in three colors of red, green and blue are arranged in a planar form; and transmission spectra of a color filter. For example, the emission spectrum of the blue light emitting layer of the organic EL element partially overlaps the transmission spectrum of a green coloring layer of the color filter, so that blue light from the blue light emitting layer partially transmits the green coloring layer. Similarly, the emission spectrum of the green light emitting layer of the organic EL element partially overlaps the transmission spectrum of a blue coloring layer of the color filter, so that green light from the green light emitting layer partially transmits the blue coloring layer. Furthermore, the emission spectrum of the red light emitting layer of the organic EL element partially overlaps the transmission spectrum of the green coloring layer of the color filter, so that red light from the red light emitting layer partially transmits the green coloring layer. For this reason, color shift or color mixing is unfavorably caused in the image displayed by a matter that light from the organic EL element of a pixel adjacent thereto enters the (image-displayed) pixel.

Following requests for making displays highly minute and fine, and making the quality thereof high, it has been becoming impossible, about each of the pixels, for the quality of the pixel, to ignore the entry of light into the pixel from the organic EL element of a pixel adjacent to the pixel.

CITATION LIST

Patent Literatures

Patent Literature 1: Japanese Patent Application Laid-Open (JP-A) No. 2006-073219
Patent Literature 2: JP-A No. 2012-185992

SUMMARY OF INVENTION

Technical Problem

As described above, in particular, following requests for making displays highly minute and fine and making the quality thereof high, concerning organic EL display devices of a white-light-emitting type or a different-color-separately-painted type, it has been becoming impossible, about each pixel thereof, for the quality of the pixel, the entry of light into the pixel from the organic EL element of a pixel to ignore adjacent to the pixel. Thus, an action thereagainst has been requested.

The present invention is an invention for coping with this problem, and the invention provides an organic EL display device capable of preventing or restraining color shift or color mixing in an image displayed in each of its pixels, this inconvenience being caused by the entry of light into the pixel from an organic EL element of a pixel adjacent to the pixel, and provides a color filter forming substrate making it possible to produce such an organic EL display device.

Solution to Problem

The color filter forming substrate of the present invention is a color filter forming substrate, for an organic EL display device, in which a pixel-dividing light-shielding region is arranged over one surface of a base material comprising a transparent substrate to make plural pixel regions into a region-divided form, and plural color-filter-forming coloring layers of multiple colors are arranged to a predetermined pixel regions in accordance with a respective color, characterized in that: a light-shielding layer is arranged in the pixel-dividing light-shielding region; and a surface of the light-shielding layer being farthest from the one surface of the base material is positioned farther from the one surface of the base material than respective surfaces of the color-filter-forming coloring layers in the respective colors, these surfaces not being the respective base material side surfaces of the coloring layers, are positioned.

This color filter forming substrate may be characterized in that the light-shielding layer arranged in the pixel-dividing light-shielding region is a single layer, and is arranged to contact the one surface of the base material.

Alternatively, the color filter forming substrate may be characterized in that: in the pixel-dividing light-shielding region, segments of the color-filter-forming coloring layers in the respective colors of any adjacent ones out of pixels are each extended to the pixel-dividing light-shielding region to have no gaps between the segments; the light-shielding layer arranged in the pixel-dividing light-shielding region is a single layer, and is arranged at a surface side of the coloring layer segment in the respective colors, which are extended to the pixel-dividing light-shielding region, this surface side not being the base material side of the coloring layers in the respective colors; the light-shielding layer is formed to contact a surface of a protective layer which covers the color-filter-forming coloring layers in the respective colors, the surface of the protective layer not being the base material-one-surface side surface of the protective layer; and the protective layer comprises an inorganic composition.

Alternatively, the color filter forming substrate may be characterized in that: the light-shielding layer arranged in the pixel-dividing light-shielding region has two layers; a first light-shielding layer thereof is arranged to contact the one surface of the base material; the segments of the color-filter-forming coloring layers in the respective colors of any adjacent ones out of pixels are each extended to cover the first light-shielding layer; a second light-shielding layer of the two layers is arranged at a surface side of the extended coloring layer segments in the respective colors, the surface side not being the base material side of the coloring layer segments; and the second light-shielding layer is larger in line width than the first light-shielding layer.

The second light-shielding layer may be characterized in that the second light-shielding layer is formed to contact a surface of the protective layer which covers the color-filter-forming coloring layers in the respective colors, the surface not being the base material-one-surface side surface of the protective layer. Furthermore, the protective layer comprises an inorganic composition.

The color filter forming substrate of the present invention is also a color filter forming substrate, for an organic EL display device, in which a pixel-dividing light-shielding region is arranged over one surface of a base material comprising a transparent substrate to make plural pixel regions into a region-divided form, and plural color-filter-forming coloring layers of multiple color are arranged to a predetermined pixel region in accordance with a respective color, characterized in that: a light-shielding layer is arranged to contact the one surface of the base material; segments of the color-filter-forming coloring layers, in the respective colors, of any adjacent ones out of pixels are each extended to cover the light-shielding layer; a resin composition layer including a blue colorant is arranged at a surface side of the extended coloring layer segments in the respective colors, the surface side not being the base material side of the extended colored coloring layer segments; and a surface of the resin composition including the blue colorant, the surface being a surface of the composition that is farther from the one surface of the base material, is positioned farther from the one surface of the base material than respective surfaces of the color-filter-forming coloring layers in the respective colors, these surfaces not being respective base material side surfaces of the coloring layers, are positioned.

In short, the present invention may be characterized in that in the above-mentioned color filter forming substrate, the second light-shielding layer is substituted with a resin composition layer including a blue colorant.

The color filter forming substrate may be characterized in that the resin composition layer including the blue colorant includes the same resin composition as used for a blue coloring layer of the color-filter-forming blue coloring layers.

In the present invention, a layer having an optical density of 2.0 or more, preferably 4.0 or more is defined as the light-shielding layer in the visible light band.

Herein, the respective surfaces of the color-filter-forming coloring layers in the respective colors, the surfaces not being respective base material side surfaces of the coloring layers, each denote a pixel-center-vicinity flat surface of one of the coloring layers, the surface being positioned at the non-base material side of the coloring layer. The position of the pixel-center-vicinity flat surface that is represented by the distance of this flat surface from the surface of the base material substantially corresponds to a position obtained by averaging, over the whole of the pixel regions, the following positions from the base material surface: individual positions of the surface positioned at the non-base material side of the coloring layer.

Any of the color filter forming substrates described above is characterized in that a light absorbing layer is formed on the pixel regions, and is characterized in that, in the light absorbing layer, carbon black is contained being dispersed as a colorant in a resin.

In this case, the light absorbing layer may be characterized in that the light absorbing layer has an average transmittance of 45% to 95% about a C light source.

Herein, the "average transmittance" is a value obtained by averaging the transmittances of the light absorbing layer over the whole of the visible light band, the transmittances being substantially flat over the whole of the visible light band.

In this case, the transmission spectrum (of the light absorbing layer) is measured, using a microscopic spectrometer (OSP-SP2000™, manufactured by Olympus Corp). From the transmission spectrum obtained by the measurement, the value Y in the XYZ display system is obtained in accordance with an expression (1) described below. The average transmittance substantially corresponds to this value.

In the expression (1), $P(\lambda)$ is the spectral composition of the light source, $y(\lambda)$ is a color-matching function in the XYZ display system, and $\tau(\lambda)$ is the spectral transmittance of an object in this case.

[Mathematical formula 1]

$$Y = \int_{400}^{700} P(\lambda) \bar{y}(\lambda) \tau(\lambda) d\lambda \quad (1)$$

The display device of the present invention is an organic EL display device, having a structure in which an organic EL element forming substrate and a color filter forming substrate are laminated, characterized in that as the latter, the above-mentioned color filter forming substrate is used.

Effects

The color filter forming substrate of the present invention has such a structure, whereby, corresponding to requests for making displays highly minute and fine and making the quality thereof high, a color filter forming substrate can be provided which can produce an organic EL display device capable of preventing or restraining color shift or color mixing in an image displayed in each of its pixels, this inconvenience being caused by the entry of light into the pixel from an organic EL element of a pixel adjacent to the pixel.

Specifically, according to a first aspect of the present invention, this matter is attained by the following in a color filter forming substrate, for an organic EL display device, in which pixel regions are made into a region-divided form through a pixel-dividing light-shielding layer over one surface of a base material comprising a transparent substrate, and plural color-filter-forming coloring layers of multiple colors are arranged to a predetermined pixel region in accordance with the respective color: a surface of the pixel-dividing light-shielding layer for making the pixel regions in the region-divided form, the surface being a surface farthest from the one surface of the base material, is positioned farther from the one surface of the base material than respective surfaces of the color-filter-forming coloring layers in the respective colors, these surfaces not being respective base material side surfaces of the coloring layers, are positioned.

According to a second aspect of the present invention, the matter is attained by the following in a color filter forming substrate, for an organic EL display device, in which a pixel-dividing light-shielding region is arranged over one surface of a base material comprising a transparent substrate to make pixel regions into a region-divided form, and plural color-filter-forming coloring layers of multiple colors are arranged to a predetermined pixel regions in accordance with the respective colors: a light-shielding layer is arranged to contact the one surface of the base material and to be positioned farther from the one surface of the base material than respective surfaces of the color-filter-forming coloring layers in the respective colors, the surfaces not being the base material side surfaces of the coloring layers, are positioned; segments of the color-filter-forming coloring layers, in the respective colors, of any adjacent ones out of pixels are each extended to cover the light-shielding layer; and a resin composition layer including a blue colorant is arranged at a surface side of the extended coloring layer segments in the respective colors, the surface side not being the base material side of the extended colored coloring layer segments.

The segments of the color-filter-forming coloring layers in the respective colors of the adjacent pixels, which cover the light-shielding layer, preferably have no gap therebetween. However, the segments may have gaps therebetween. In other words, the wording "segments of the color-filter-forming coloring layers, in the respective colors, of any adjacent ones out of pixels of the pixel regions are each extended to cover the light-shielding layer" includes, as the meaning thereof, a case where the coloring layer segments in the respective colors are arranged without any gap therebetween to cover the whole of the light-shielding layer, and a case where the coloring layer segments in the respective colors are arranged with gaps therebetween to make partial regions of the light-shielding layer naked.

More specifically, the first aspect may be a $1^{st}$-1 aspect in which the first aspect is characterized in that the light-shielding layer arranged in the pixel-dividing light-shielding region is a single layer, and is arranged to contact the one surface of the base material; a $1^{st}$-2 aspect in which the first aspect is characterized in that: in the pixel-dividing light-shielding region, segments of the color-filter-forming coloring layers in the respective colors of any adjacent ones out of pixels are each extended to the pixel-dividing light-shielding region to have no gaps between the segments; and the light-shielding layer arranged in the pixel-dividing light-shielding region is a single layer, and is arranged at a surface side of the coloring layer segments in the respective colors, which are extended to the pixel-dividing light-shielding region, this surface side not being the base material side of the coloring layers in the respective colors; or a $1^{st}$-3 aspect in which the first aspect is characterized in that: the light-shielding layer arranged in the pixel-dividing light-shielding region has two layers; a first light-shielding layer thereof is arranged to contact the one surface of the base material; segments of the color-filter-forming coloring layers in the respective colors of any adjacent ones out of pixels are each extended to cover the first light-shielding layer; and a second light-shielding layer of the two layers is arranged at a surface side of the extended coloring layer segments in the respective colors, the surface side not being the base material side of the coloring layer segments.

In this case also, the segments of the coloring layers in the respective colors of the adjacent pixels, which cover the first light-shielding layer, preferably have no gap therebetween. However, the segments may have gaps therebetween. In other words, the wording "segments of the color-filter-forming coloring layers in the respective colors of any adjacent ones out of pixels are each extended to cover the first light-shielding layer" includes, as the meaning thereof, a case where the coloring layer segments in the respective colors are arranged without any gap therebetween to cover the whole of the first light-shielding layer, and a case where the coloring layer segments in the respective colors are arranged with gaps therebetween to make partial regions of the first light-shielding layer naked.

A brief description is herein made with reference to FIG. 7 about a matter that in each pixel in an organic EL display device of a white light source type in which the color filter forming substrate of the present invention is used, color shift or color mixing in an image displayed (in the pixel) can be prevented or restrained, this inconvenience being caused by the entry of light into the pixel from an organic EL element of a pixel adjacent to the pixel.

First, as illustrated in FIG. 7A, in the case of an organic EL display device of a white light source type in which a conventional color filter forming substrate 10A is used, almost entire white light from an organic EL element 22A arranged in a pixel region 17a advances, like a light ray L11, into a direction perpendicular to the plane of a base material 11 of the color filter forming substrate 10A and reaches a red coloring layer 13R in the pixel region 17a to pass through this substrate. A part of the light passes, like a light ray L13, through the red coloring layer 13R arranged in the pixel region 17a to be radiated into a green coloring layer 13G of a pixel region 17b adjacent to the pixel region 17a to pass through this substrate, or the part is directly radiated, like a light ray L12, into the green coloring layer 13G arranged to the adjacent pixel region 17b to pass through this substrate.

The light ray L13 passes through the red coloring layer 13R and the green coloring layer 13G so that almost all thereof is cut according to the respective transmission properties of the red coloring layer 13R and the green coloring layer 13G. However, the light ray L12 passes through only the green coloring layer 13G so that a light ray that should not be originally radiated out is radiated out in accordance with the transmission property of the green coloring layer 13G.

For this reason, color shift or color mixing in the displayed image is generated dependently on the direction in which the image is viewed, particularly, by effect of the light ray L12.

By contrast, as illustrated in FIG. 7B, in the case of an organic EL display device in which a color filter forming substrate 10 of the $1^{st}$-1 aspect of the present invention is used, a light ray L22 corresponding to the light ray L12 represented in FIG. 7A is cut by a light-shielding layer 12, and a light ray (not illustrated) corresponding to the light ray L13 represented in FIG. 7A is also cut.

Accordingly, color shift or color mixing in the image displayed is not generated, this inconvenience being caused by such light rays and being dependent on the direction in which the image is viewed.

As illustrated in FIG. 7C, in the case of an organic EL display device in which a color filter forming substrate 10a of the $1^{st}$-2 aspect of the present invention is used, a light ray L32 corresponding to the light ray L12 represented in FIG. 7A is cut by a light-shielding layer 12a, and a light ray L33 corresponding to the light ray L13 represented in FIG. 7A partially passes through this substrate.

In this aspect, the light ray L32 corresponding to the light ray L12 represented in FIG. 7A is cut by the light-shielding layer 12a, so that color shift or color mixing in the image displayed is not generated, this inconvenience being dependent on the direction in which the image is viewed.

In the case of an organic EL display device in which a color filter forming substrate 10b of the $1^{st}$-3 aspect of the present invention is used, a light ray corresponding to the light ray L12 represented in FIG. 7A is cut by a second light-shielding layer 12b2 represented in FIG. 3, and most light ray corresponding to the light ray L13 represented in FIG. 7A is cut by a first light-shielding layer 12b1 represented in FIG. 3. Accordingly, color shift or color mixing in the image displayed is not generated, this inconvenience being caused by light rays corresponding to the light rays L12 and L13 represented in FIG. 7A.

In the $1^{st}$-3 aspect, it is sufficient for most light ray corresponding to the light ray L13 represented in FIG. 7A to be cut by the first light-shielding layer 12b1. Even when the first light-shielding layer 12b1 is made smaller in line width than the second light-shielding layer 12b2, color shift or color mixing in the image displayed is not generated in the same way, this inconvenience being caused by light rays corresponding to the light rays L12 and L13 represented in FIG. 7A and being dependent on the direction in which the image is viewed.

Also in an organic EL display device of a different-color-separately-painted type in which the color filter forming substrate of the present invention is used, color shift or color mixing in the image displayed can be prevented or restrained, this inconvenience being caused by the entry of light from an organic EL element of an adjacent pixel. This matter is briefly described with reference to the same figures referred to above, i.e., FIGS. 7A to 7C.

First, as illustrated in FIG. 7A, in the case of an organic EL display device of a different-color-separately-painted type in which a conventional color filter forming substrate 10A is used, most red light from an organic EL element 22A arranged in a pixel region 17a advances, like a light ray L11, into a direction perpendicular to the plane of a base material 11 of the color filter forming substrate 10A and reaches a red coloring layer 13R in the pixel region 17a to pass through this substrate. A part of the light passes, like a light ray L13, through the red coloring layer 13R arranged in the pixel region 17a to be radiated into a green coloring layer 13G of an adjacent pixel region 17b to pass through this substrate, or the part is directly radiated into the green coloring layer 13G arranged in the adjacent pixel region 17b to pass through this substrate as the light ray L12.

As has been described in FIG. 15, the red light from the red light emitting layer of the organic EL element may partially pass through the green coloring layer. In FIG. 7A, the light ray L12 passes only through the green coloring layer 13G so that a light ray that should not be originally radiated out is radiated out in accordance with the transmission property of the green coloring layer 13G. When blue light from the blue coloring layer of the organic EL element partially passes through the green coloring layer, this situation not being illustrated, similarly a light ray that should not be originally radiated out, out of rays of the blue light, is radiated out in accordance with the transmission property of the green coloring layer. When green light from the green coloring layer of the organic EL element partially passes through the blue coloring layer, a light ray that should not be originally radiated out, out of rays of green light, is radiated out in accordance with the transmission property of the blue coloring layer.

Accordingly, color shift or color mixing in the image displayed is generated dependently on the direction in which the image is viewed, this inconvenience being caused, particularly, by the light ray L12.

By contrast, as illustrated in FIG. 7B, FIG. 7C and FIGS. 3A and 3B, in the case of the organic EL display devices in which the color filter forming substrates 10, 10a and 10b of the $1^{st}$-1, $1^{st}$-2 and $1^{st}$-3 aspects of the present invention are used, respectively, light rays corresponding to the light rays L12 and L13 represented in FIG. 7A can be cut as described above so that color shift or color mixing in the image displayed can be prevented or restrained, this inconvenience being caused by such light rays.

In the $1^{st}$-2 aspect, in the case of forming the light-shielding layer on the surface of the protective layer covering the color-filter-forming coloring layers in the respective colors, the surface not being the base material-one-surface side surface of the protective layer, it is expected that by the laying of the protective layer, planarization is achieved and the underlay of the protective layer is stabilized. Thus, the formation of the light-shielding layer is certainly made easy. When the protective layer is made of an inorganic composition, this layer can further ensure an optical property, and the layer can be stabilized as an underlay when the light-shielding layer is formed.

In the $1^{st}$-3 aspect, in the case of forming the second light-shielding layer on the surface of the protective layer covering the color-filter-forming coloring layers in the respective colors, the surface not being the base material-one-surface side surface of the protective layer, it is equivalently expected that by the laying of the protective layer, the color filter forming substrate is made flat and the underlay of the protective layer is stabilized. Thus, the formation of the second light-shielding layer is certainly made easy. When the protective layer is made of an inorganic composition, this layer can further ensure an optical property, and the layer can be stabilized as an underlay when the second light-shielding layer is formed.

In the case of the organic EL display device using the color filter forming substrate of the second aspect, in which the second light-shielding layer in the color filter forming substrate of the $1^{st}$-3 aspect of the present invention is substituted with a resin composition layer including a blue colorant, a light ray corresponding to the light ray L12 represented in FIG. 7A is effectively absorbed into the coloring layer arranged in the region of each of the pixels in accordance with the transmission property of the resin composition layer including the blue colorant when the light ray passes through the coloring layer. It is therefore possible to restrain effectively color shift or color mixing, in the displayed image, which is caused by the light ray corresponding to the light ray L12 represented FIG. 7A.

In the case of the aspect in which the resin composition layer including the blue colorant includes the same resin composition as used in a blue coloring layer of the color-filter-forming coloring layers, the color-filter-forming blue coloring layer and the resin composition layer including the blue colorant can be formed together through a single processing in the production of the aspect.

By rendering any one of the aspects into an embodiment in which a light absorbing layer is laminated over the pixel regions, a display device can be produced which can attain a decline in the reflection of external light and the prevention of a lowering in displayed brightness, besides color-mixing-preventing effect.

The light absorbing layer may be specifically a layer in which carbon black is contained as a colorant and being dispersed in a resin. However, the light absorbing layer is not limited to this layer.

In such an embodiment, at the time when the average transmittance of the light absorbing layer is from 45% to 95% about a C light source, particularly, the external-light-decreasing effect, as well as the brightness obtained when an image is displayed, can be made larger than in the embodiment illustrated in FIG. 11B, in which a circularly polarizing plate is used.

As described above, the "average transmittance" referred to herein is a value obtained by averaging the transmittances of the light absorbing layer over the whole of the visible light band, the transmittances being substantially flat over the whole of the visible light band.

In a case where the light transmittance of the light absorbing layer is rarely varied and flat over the whole of the visible light band (range of wavelengths from 400 nm to 700 nm) when an image is displayed, color shift caused by laying the light absorbing layer can be decreased at the image-displaying time.

Advantageous Effects of Invention

As described above, to particularly meet requests for making displays highly minute and fine and making the quality thereof high, the present invention makes it possible to produce an organic EL display device capable of preventing or restraining color shift or color mixing in an image displayed in each of its pixels, this inconvenience being caused by the entry of light into the pixel from an organic EL element of a pixel adjacent to the pixel; and simultaneously makes it possible to provide a color filter forming substrate making it possible to produce such an organic EL display device.

BRIEF DESCRIPTION OF DRAWINGS

FIGS. 12A to 12D are each a partial sectional view illustrating a different example of the color filter forming substrate of the present invention.

FIGS. 14A and 143 are each a partial sectional view of a sixth example of the embodiment of the color filter forming substrate of the present invention.

DESCRIPTION OF EMBODIMENTS

1. First Example of Embodiment of Color Filter Forming Substrate of the Invention A description is initially made about a first example of an embodiment of the color filter forming substrate of the present invention with reference to FIG. 1A.

Figure 1A:
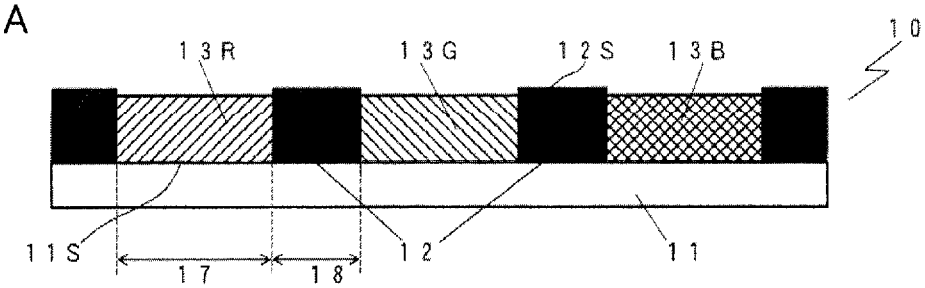
FIG. 1A is a partial sectional view of a first example of an embodiment of the color filter forming substrate of the present invention.

A color filter forming substrate 10 of the first example is a color filter forming substrate for an organic EL display device, in which: a pixel-dividing light-shielding region 18 is arranged over one surface 11S of a base material 11 comprising a transparent substrate to make plural pixel regions 17 into a region-divided form on; and color-filter-forming coloring layers 13R, 13G and 13B in three colors of R, G and B are arranged to the pixel regions 17 to be divided in accordance with the respective colors. As illustrated in FIG. 1A, a surface 12S of a light-shielding layer 12 of the pixel-dividing light-shielding region 18 for making the pixel regions 17 into the region-divided form, this surface 12S being a surface farthest from the one surface of the base material 11, is positioned farther from the surface 11S of the base material 11 than respective surfaces of the color-filter-forming coloring layers 13R, 13G and 13B in R, G and B, these surfaces not being respective base material-11 side surfaces of the coloring layers, are positioned.

In FIG. 1A, white pixels are not illustrated; however, regions for the white pixels are also made into a region-divided form through the light-shielding layer 12 of the pixel-dividing light-shielding region 18.

In the present example, the light-shielding layer 12 of the pixel-dividing light-shielding region 18 is, particularly, a single layer contacting the surface 11S of the base material 11.

Figure 1B:
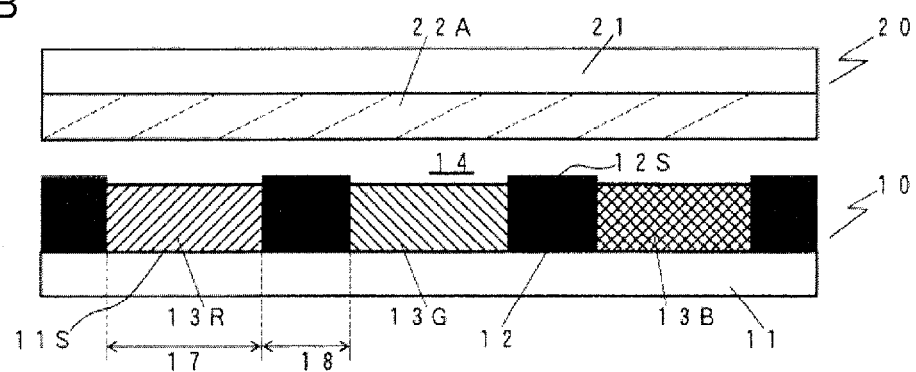
FIG. 1B is a partial sectional view of an organic EL display device using the color filter forming substrate of the first example illustrated in FIG. 1A.

As illustrated in FIG. 1B, the color filter forming substrate 10 of the first example is transformed to an organic EL display device by stacking this substrate 10 and an organic EL element forming substrate 20 over each other with a predetermined interval to sandwich an insulating resin layer 14 therebetween. This organic EL element forming substrate 20 is, for example, a substrate in which for individual pixels (or for each pixel), a white-light-emitting organic EL element (also referred to as an organic light emitting element or organic EL light emitting element) 22A is formed; or a substrate in which organic EL elements 22A are formed in which respective light emitting layers in multiple colors such as red, green and blue are arranged in a planar form.

For reference, any organic EL display device having one or more organic EL elements in which light emitting layers in multiple colors are arranged in a planar form may be referred to as an organic EL display device of a different-color-separately-painted type.

Figure 7A:
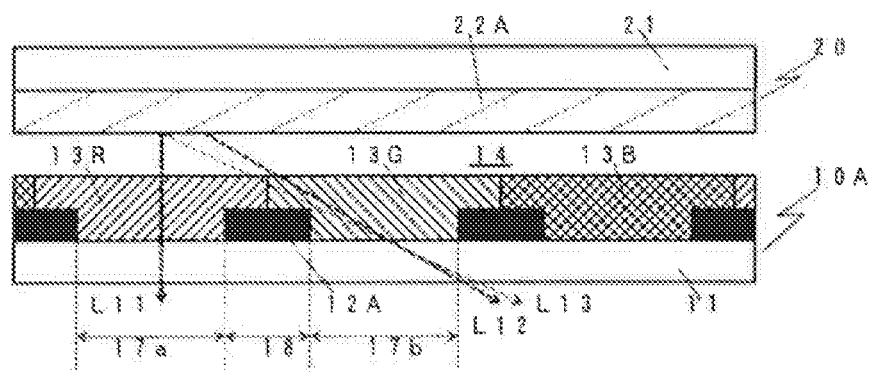
FIG. 7A is a partial sectional view illustrating light rays from an organic EL element in an organic EL display device using a conventional color filter forming substrate 10A.
Figure 7B:
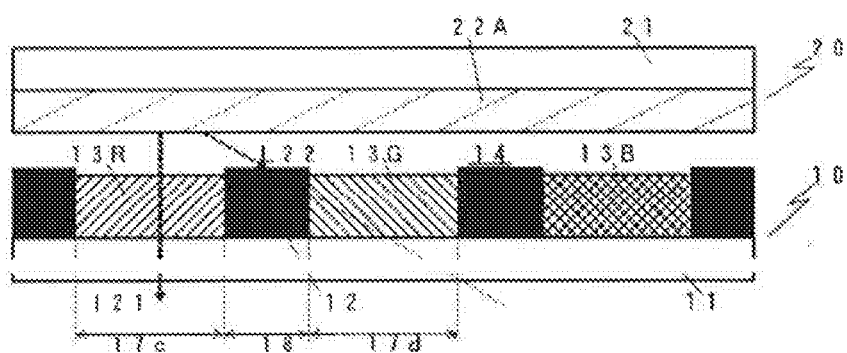
FIG. 7B is a partial sectional view illustrating light rays from an organic EL element in an organic EL display device using the color filter forming substrate 10 of the first example illustrated in FIG. 1A.
Figure 7C:
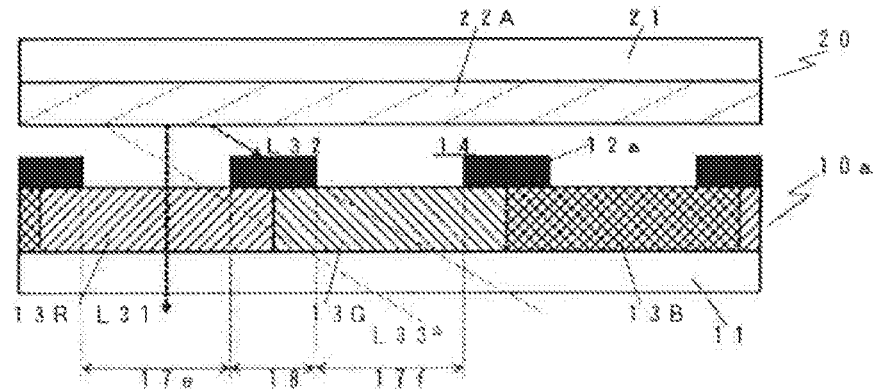
FIG. 7C is a partial sectional view illustrating light rays from an organic EL element in an organic EL display device using the color filter forming substrate 10a of the second example illustrated in FIG. 2A.

In the case of using the color filter forming substrate 10 of the first example in an organic EL display device of a white-light-emitting type or a different-color-separately-painted type, this substrate 10 is made into a form as described above, thereby making it possible to cut light rays corresponding to the light ray L12 and the light ray L13 in the conventional organic EL display device which has been illustrated in FIG. 7A, that is, light rays existing by a matter that light emitted from the organic EL element of some pixel of the pixels has entered the coloring layer in a region of a pixel adjacent to the pixel. The cutting makes it possible to prevent the generation of color shift or color mixing in the image displayed, the generation being caused by such light rays and being dependent on the direction in which the image is viewed.

Examples of the organic EL display device include mobile electronic instruments, such as notebook computers as mobile models, and multifunctional terminal instruments (also referred to as high-functioning terminal instruments). However, the display device is not limited to these examples.

The following will describe each of the members of the color filter forming substrate 10 illustrated in FIG. 1A and the organic EL display device illustrated in FIG. 1B.

<Base Material 11>

The base material 11 used in the first example comprising a transparent substrate and may be a base material used conventionally for color filters. The base material 11 may be, for example, an inflexible transparent inorganic substrate such as a quartz glass, Pyrex (registered trade name) glass or synthetic quartz substrate; a transparent resin film; or a flexible transparent resin substrate such as a resin plate for optics. The base material 11 is in particular preferably any inorganic substrate. Out of substrate species, a glass substrate is preferred.

Out of glass substrate species, a glass substrate of a non-alkali type is preferred. The non-alkali type substrate is excellent in dimension stability and workability in high-temperature heating treatment, and the glass contains no alkali component; thus, the glass substrate is favorably usable for a color filter for display devices.

The substrate is usually a transparent substrate.

<Light-Shielding Layer 12 of the Pixel-Dividing Light-Shielding Region>

For a light-shielding coloring layer for forming the light-shielding layer 12 of the pixel-dividing light-shielding region for making the pixel regions of the color-filter-forming coloring layers in the respective colors into the region-divided form, for example, a material is used in which carbon black coated with a resin such as an epoxy resin is dispersed, as pigment, in a binder resin in this example.

The material, in which the carbon black is disperse as pigment, in the binder resin, can be made into a light-shielding resin layer while the film thickness thereof is made relatively small.

In this example, the light-shielding coloring layer for the light-shielding layer 12 in the pixel-dividing light-shielding region is formed, using photolithography. In this case, a binder resin therefor is, for example, a light sensitive resin having a reactive vinyl group, such as an acrylate type, methacrylate type, polyvinyl cinnamate type, or cyclized rubber type resin.

In this case, a photopolymerization initiator may be added to a light sensitive resin composition for forming the light-shielding layer 12 in the pixel-dividing light-shielding region, which contains a black colorant and the light sensitive resin. Furthermore, as required, thereto may be added a sensitizer, a paintability improver, a development improver, a crosslinking agent, a polymerization inhibitor, a plasticizer, a flame retardant, and others.

The light-shielding coloring layer for forming the light-shielding layer 12 in the pixel-dividing light-shielding region may be formed by a printing or ink-jetting method. In this case, examples of a binder resin therefor include a polymethyl methacrylate resin, a polyacrylate resin, a polycarbonate resin, a polyvinyl alcohol resin, a polyvinyl pyrrolidone resin, a hydroxyethylcellulose resin, a carboxymethylcellulose resin, a polyvinyl chloride resin, a melamine resin, a phenolic resin, an alkyd resin, an epoxy resin, a polyurethane resin, a polyester resin, a maleic acid resin, and a polyamide resin.

The light-shielding layer may be a metal film. The metal film may be, for example, a single layer of chromium, a multilayered film of chromium oxide ($CrO_x$) and chromium, a multilayered film of chromium oxide ($CrO_x$), chromium nitride ($CrN_y$) and chromium, or a multilayered film of chromium and chromium oxynitride ($CrN_yO_x$) in which "x" and "y" are each an arbitrary number.

The material of the metal film may be a metal or an alloy besides the above-mentioned materials. Examples of the metal include silver, aluminum, gold, beryllium, calcium, cadmium, cobalt, copper, iron, gallium, hafnium, indium, iridium, potassium, lanthanum, lithium, magnesium, molybdenum, sodium, niobium, nickel, osmium, lead, palladium, platinum, rubidium, rhenium, rhodium, ruthenium, antimony, silicon, tin, strontium, tantalum, thorium, titanium, thallium, uranium, vanadium, tungsten, yttrium, ytterbium, zinc, and zirconium. Examples of the alloy include silver-palladium-copper (APC), silver-ruthenium-copper (ARC), alumel, brass, constantan, duralumin, bronze, carbon steel, nickelin, platinum/rhodium, Hyperco, Hypernick, permalloy, Permendur, platinoid, manganin, monel, German silver, and phosphorus bronze. One or more of these metals and alloys may be made into a single layer or a multilayered film.

When the light-shielding layer is a metal film, the method for forming the light-shielding layer is, for example, a method of forming a metal film onto the whole of a surface by sputtering or vapor deposition to be embedded between the coloring layers and cover the coloring layers, forming a photoresist layer onto the metal film, exposing the photoresist layer to light, developing the light-exposed layer, etching portions of the metal film that are not covered with the photoresist film, and then removing the photoresist layer.

The shape of a pattern of openings in the light-shielding layer 12 in the pixel-dividing light-shielding region, and the arrangement of the coloring layer in each of the colors are not limited. The opening pattern of the light-shielding layer 12 in the pixel-dividing light-shielding region may be in a stripe form, an L-shaped form, a delta arrangement form, or any other form obtained by varying the arrangement of the coloring layers.

In this example, the light-shielding layer is a layer having an optical density of 2.0 or more, preferably 4.0 or more in the visible light band.

As illustrated in each of FIGS. 12A and 12B, in the first example, the light-shielding layer 12 in the pixel-dividing light-shielding region may be formed to cover respective ends of segments of the color-filter-forming coloring layers 13R and 13G, and the color-filter-forming coloring layer 13B (not illustrated) in the respective colors.

<Coloring Layers 13R, 13G and 13B>

In the present example, the color-filter-forming coloring layers in the respective colors are coloring layers in three colors of the red coloring layer 13R, the green coloring layer 13G, and the blue coloring layer 13B.

The coloring layer in each of the colors is a layer formed by a photolitho method (also referred to as photolithography) using a colored-portion-forming resin composition in which a colorant (also referred to as a coloring material), such as a pigment or dye, in the respective color is dispersed or dissolved in a binder resin.

The binder resin usable in the coloring layer is, for example, a light sensitive resin having a reactive vinyl group, such as an acrylate type, methacrylate type, polyvinyl cinnamate type, or cyclized rubber type resin.

In this case, a photopolymerization initiator may be added to a colored-portion-forming light sensitive resin composition, which contains the colorant and the light sensitive resin. Furthermore, as required, thereto may be added a sensitizer, a paintability improver, a development improver, a crosslinking agent, a polymerization a plasticizer, a flame retardant, and others.

The film thickness of the coloring layer in each of the colors is usually set into the range of about 1 µm to 5 µm.

Colors of such coloring layers are not particularly limited as far as the colors include at least three colors of red, green and blue. Thus, the colors may be rendered, for example, three colors of red, green and blue, four colors of red, green, blue and yellow, or five colors of red, green, blue, yellow and cyan.

Examples of a colorant usable in the coloring layer in red (also represented by R) include perylene pigments, lake pigments, azo pigments, quinacridone pigments, anthraquinone pigments, anthracene pigments, and isoindoline pigments. These pigments may be used alone or in the form of a mixture of two or more thereof.

Examples of a colorant usable in the coloring layer in green (also represented by G) include halogen-multi-substituted phthalocyanine pigments, halogen-multi-substituted copper phthalocyanine pigments, other phthalocyanine pigments, triphenylmethane basic dyes, isoindoline pigments, isoindolinone pigments. These pigments may be used alone or in the form of a mixture of two or more thereof.

Examples of a colorant usable in the coloring layer in blue (also represented by B) include copper phthalocyanine pigments, anthraquinone pigments, indanthrene pigments, indophenol pigments, cyanine pigments, and dioxazine pigments. These pigments may be used alone or in the form of a mixture of two or more thereof.

<White Layer>

In FIG. 1A, this layer is not illustrated. Therefor, a resin is used which is obtained by excluding the colorant (coloring material) from, for example, the resin composition for forming any one of the light-shielding layer 12 in the pixel-dividing light-shielding region, and the coloring layers 13R, 13G and 13B. This layer is formed by photolithography. However, the method for the formation is not limited to this method.

<Insulating Resin Layer 14>

The material of the insulating resin layer 14 may be a thermosetting resin composition, or a photosetting resin composition.

For the photosetting resin composition, a resin is usable which is identical or equivalent to the binder resin usable in the color-filter-forming coloring layer in each of the colors. The resin may be a light sensitive resin having a reactive vinyl group, such as an acrylate type, methacrylate type, polyvinyl cinnamate type, or cyclized rubber type resin.

In this case also, a photopolymerization initiator may be added to a light sensitive resin composition containing the light sensitive resin. Furthermore, as required, thereto may be added a sensitizer, a paintability improver, a development improver, a crosslinking agent, a polymerization inhibitor, a plasticizer, a flame retardant, and others.

The thermosetting resin composition may be a composition using an epoxy compound, or a composition using a thermal radical initiator.

The epoxy compound may be a known polyvalent epoxy compound curable with a carboxylic acid, an amine compound or some other. Such epoxy compounds are disclosed over a wide range in Masaki Shimbo edited, "Epoxy Resin Handbook", published by Nikkan Kogyo Shimbun, Ltd. (in 1987). Compounds therein are usable.

The thermal radical initiator may be at least one selected from the group consisting of persulfates, halogens such as iodine, azo compounds, and organic peroxides, and is more preferably any azo compound, or any organic peroxide.

Examples of the azo compound include 1,1'-azobis(cyclohexane-1-carbonitrile), 1-[(1-cyano-1-methylethyl)azo]formamide, 2,2'-azobis-[N-(2-propenyl)-2-methylpropionamide], 2,2'-azobis(N-butyl-2-methylpropionamide), and 2,2'-azobis(N-cyclohexyl-2-methylpropionamide).

Examples of the organic peroxide include di(4-methylbenzoyl) peroxide, t-butyl peroxy-2-ethyl hexanoate, 1,1-di(t-hexylperoxy)cyclohexanone, 1,1-di(t-butylperoxy)cyclohexane, t-butyl peroxybenzoate, t-butyl peroxy-2-ethylhexyl monocarbonate, t-butyl-4,4-di-(t-butylperoxy) butanate, and dicumyl peroxide.

<Organic EL Element Forming Substrate 20>

(1) Base Material 21

For the base material 21, the same material as used for the base material 11 is basically usable. In the case of the organic EL display device illustrated in FIG. 1B, in which the color filter forming substrate of the first example is used, displaying is attained in the state that light is radiated into the outside from the base material-11 side thereof; thus, the base material 21 does not need to be transparent.

(2) Organic EL Element(s) (Referred to as Organic Light Emitting Element(s) or Organic EL Light Emitting Element(s)) 22A The organic EL element(s) may be one or more white-light-emitting organic EL elements; or may be organic EL elements in which respective light emitting layers in multiple colors such as red, green and blue are arranged in a planar form. Of the two species, the former is preferred. In an organic EL display device of a white light source type, color shirt or color mixing in its displaying pixel is easily caused by light leakage into a pixel adjacent thereto; thus, the structure of the present invention is useful therefor.

Figure 8:
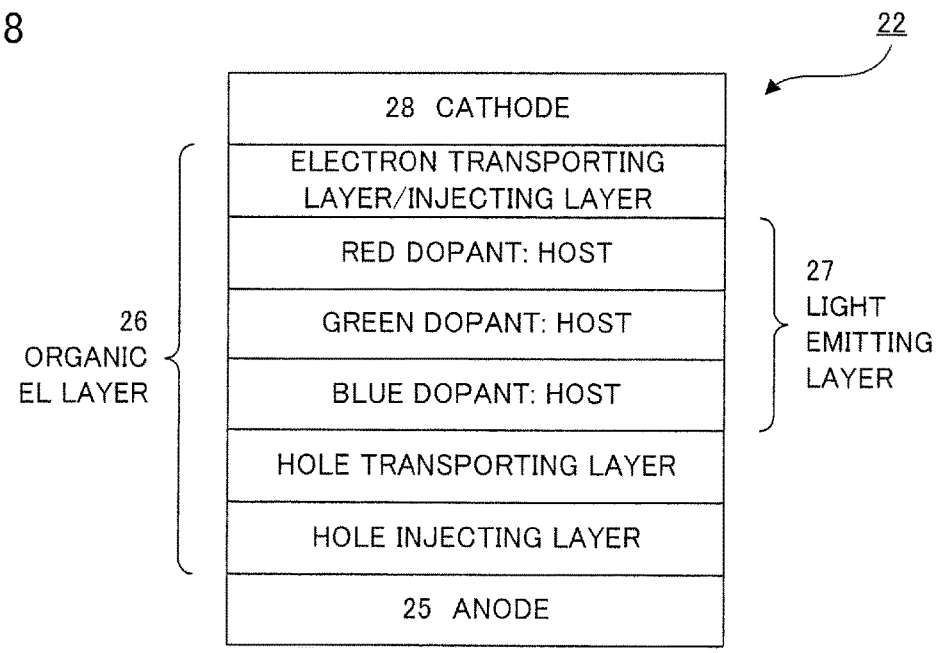
FIG. 8 is a schematic layer-structure view illustrating a structural example of an organic EL element.

About the white-light-emitting organic EL element 22A illustrated in FIG. 1B, the material structure thereof is rendered, for example, a material structure as illustrated in FIG. 8 although the structure is not illustrated in FIG. 1B.

An organic EL element 22 illustrated in FIG. 8 is an element in which three materials for emitting red, green and blue lights, respectively, are used to combine these lights with each other to emit white light.

Of course, the material of the organic EL element 22 is not limited to the combination of the three materials as far as the element can emit desired white light rays.

Figure 13:
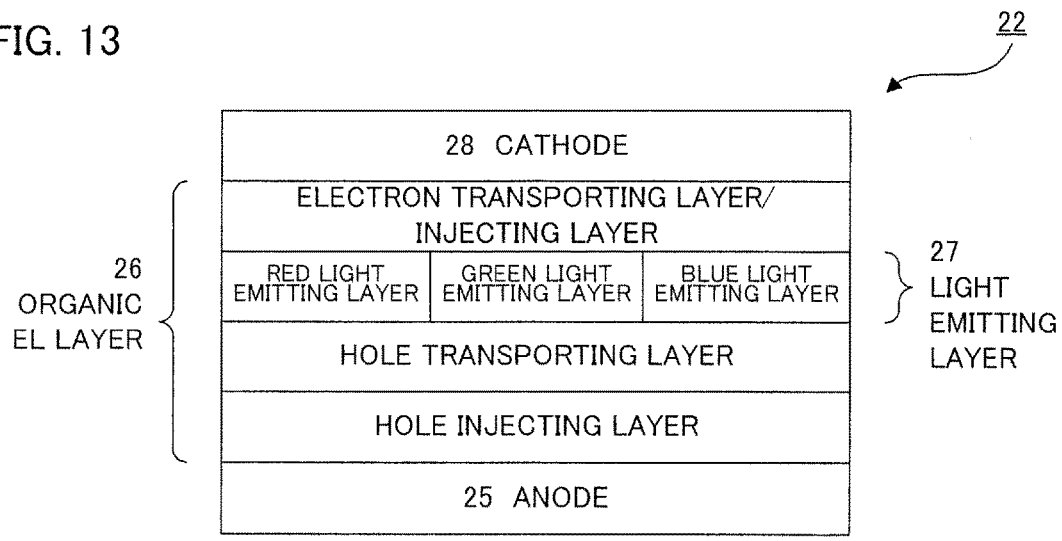
FIG. 13 is a schematic layer-structure view illustrating a structural example of an organic EL element.

In the case of organic EL elements in which respective light emitting layers in multiple colors are arranged in a planar form, the structure thereof may be rendered, for example, a structure as illustrated in FIG. 13. In an organic EL element 22 illustrated in FIG. 13, light emitting layers in three colors, that is, a red light emitting layer, a green light emitting layer and a blue light emitting layer are arranged in the form of a plane. The combination of such light emitting layers is not particularly limited as far as the combination makes it possible to attain full color displaying.

(Organic EL Layer 26)

An organic EL layer 26 that forms the organic EL element 22 is made of one or more organic layers including at least a light emitting layer 27.

Examples of the organic layer(s) that is/are other than the light emitting layer and constitute(s) the organic EL layer 26 include a hole injecting layer, a hole transporting layer, an electron injecting layer, and an electron transporting layer.

In many cases, this hole transporting layer is integrated with a hole injecting layer by giving a hole transporting function to the hole injecting layer.

The organic layer(s) that constitute(s) the organic EL layer may (each) be a hole blocking layer, an electron blocking layer, or any other layer which prevents the penetration of holes or electrons and further prevents the diffusion of excitons to confine the excitons in the light emitting layer, thereby heightening the recombination efficiency.

It is sufficient for the structure of the organic EL layer to be an ordinary structure. Examples thereof include only the light emitting layer, the hole injecting layer/the light emitting layer, the hole injecting layer/the light emitting layer/the electron injecting layer, the hole injecting layer/the hole blocking layer/the light emitting layer/the electron injecting layer, and the hole injecting layer/the light emitting layer/the electron transporting layer.

In the white-light-emitting organic EL elements 22, the light emitting material thereof is hardly made of a single compound, and is generally composed of two or three light emitting materials different from each other in emission color. In this case, the emission spectrum thereof is in such a form that the respective emission spectra of the respective light emitting materials in the colors are combined with each other.

(Anode 25 and Cathode 28)

The conductive material that forms an electrode layer of each of an anode 25 and a cathode 28 is generally a metal material, but may be an organic substance or an inorganic compound, or a mixture of multiple materials.

About the electrode layer of each of the anode and the cathode, it is appropriately selected in accordance with a light-taking-out surface whether or not the electrode layer has transparency.

For the anode 25, a conductive material is preferably used which is large in work function to make the injection of holes thereinto easy. For the cathode 28, a conductive material is preferably used which is small in work function to make the injection of electrons thereinto easy.

When transparency is required for the conductive material, examples of the conductive material include In—Zn—O (IZO), In—Sn—O (ITO), Zn—O—Al, and Zn—Sn—O. When transparency is not required therefor, examples of the conductive material include metals. Specific examples thereof include Au, Ta, W, Pt, Ni, Al, Pd, Cr, Al alloys, Ni alloys, and Cr alloys.

It is preferred that any one of the respective electrode layers of the anode 25 and the cathode 28 is relatively small in resistance.

The method for forming each of the electrode layers may be an ordinary method of forming a film of an electrode. Examples thereof include sputtering, ion plating, vacuum vapor deposition, CVD, and printing methods. The method for patterning the electrode layer may be photolithography.

2. Second Example of Embodiment of Color Filter Forming Substrate of the Invention The following will describe a second example of the embodiment of the color filter forming substrate of the present invention.

Figure 2A:
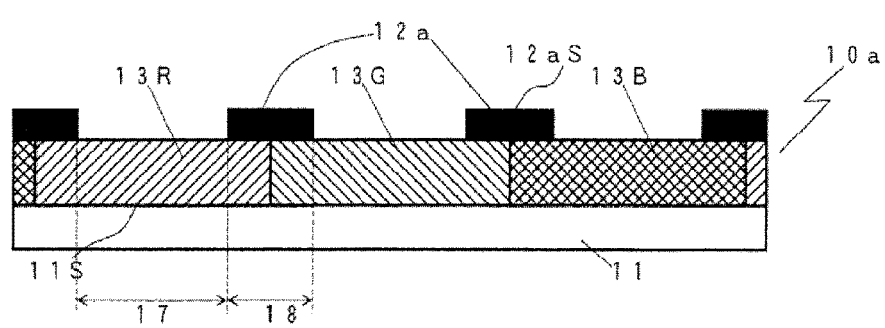
FIG. 2A is a partial sectional view of a second example of the embodiment of the color filter forming substrate of the present invention.

In the same manner as in the first example, a color filter forming substrate 10a of the second example is also a color filter forming substrate for an organic EL display device, in which: through a light-shielding layer 12a of a pixel-dividing light-shielding region 18, pixel regions 17 are made in a region-divided form on one surface 11S of a base material 11 comprising a transparent substrate; and color-filter-forming coloring layers 13R, 13G and 13B in three colors of R, G and B are arranged in the pixel regions 17 to be divided in accordance with the respective colors. In the second example, however, as illustrated in FIG. 2A, segments of the color-filter-forming coloring layers 13R, 13G and 13B in the respective colors of any adjacent ones out of the pixels are extended to the pixel-dividing light-shielding region 18 to be arranged with no gap therebetween. The light-shielding layer arranged in the pixel-dividing light-shielding region 18 is a single layer (the light-shielding layer 12a), and is arranged at a surface side of the segments of the coloring layers 13R, 13G and 13B in the respective colors extended to the pixel-dividing light-shielding region 18, this surface side not being the base material-11 side of the coloring layer 13R, 13G and 13B segments.

Also in this example, a surface 12aS of the light-shielding layer 12a of the pixel-dividing light-shielding region 18, being farthest from the surface 11S of the base material, is positioned farther from the surface 11S of the base material 11 than respective surfaces of the color-filter-forming coloring layers 13R, 13G and 13B in the respective colors, not being respective base material-11 side surfaces of the coloring layers, are positioned.

In the case of using the color filter forming substrate 10a of the second example in an organic EL display device of a white-light-emitting type or a different-color-separately-painted type, this substrate 10a is made into a form as described above, thereby making it possible to cut a light ray corresponding to the light ray L12 in the conventional organic EL display device illustrated in FIG. 7A, that is, a light ray existing by a matter that light emitted from the organic EL element of some pixel of the pixels has directly entered the coloring layer in a region of a pixel adjacent to the pixel. The cutting makes it possible to prevent the generation of color shift or color mixing in the image displayed, the generation being caused by such a light ray and being dependent on the direction in which the image is viewed.

The color filter forming substrate 10a of the second example is also applied to an organic EL display device for any one of mobile electronic instruments, such as notebook computers as mobile models, and multifunctional terminal instruments (also referred to as high-functioning terminal instruments). However, the usage thereof is not limited to these examples.

Each of the members of the color filter forming substrate and the organic EL display device may be the same as in the first example.

In the second example, the segments of the color-filter-forming coloring layers in the respective colors are arranged without having any gap therebetween. As illustrated in, for example, FIG. 12C, ends of any adjacent two out of segments of color-filter-forming coloring layers 13R and 13G, and a color-filter-forming coloring layer 13B (not illustrated) may be formed to overlap each other in a pixel-dividing light-shielding region when the ends are viewed in plan.

3. Third Example of Embodiment of Color Filter Forming Substrate of the Invention The following will describe a third example of the embodiment of the color filter forming substrate of the present invention.

Figure 3A:
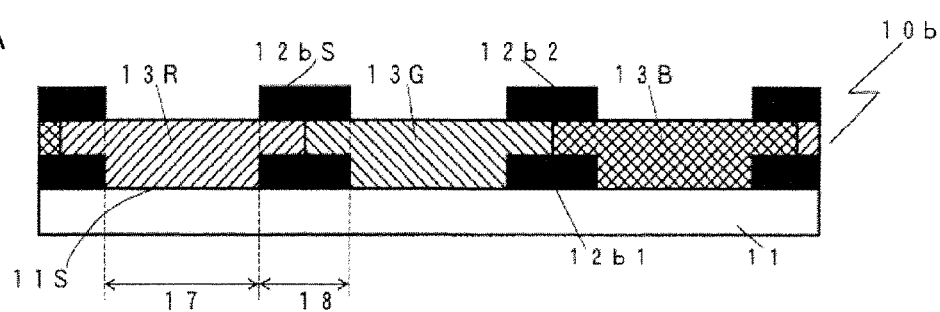
FIG. 3A is a partial sectional view of a third example of the embodiment of the color filter forming substrate of the present invention.

In the same manner as in the first and second examples, a color filter forming substrate 10b of the third example is also a color filter forming substrate for an organic EL display device, in which: a pixel-dividing light-shielding region 18 is arranged over one surface 11S of a base material 11 comprising a transparent substrate to make plural pixel regions 17 into a region-divided form on; and color-filter-forming coloring layers 13R, 13G and 13B in three colors of R, G and B are arranged in the pixel regions 17 to be divided in accordance with the respective colors. In the third example, however, as illustrated in FIG. 3A, light-shielding layers arranged in the pixel-dividing light-shielding region 18 are, in particular, two layers (a first light-shielding layer 12$b$1 and a second light-shielding layer 12$b$2). The first light-shielding layer 12$b$1 is arranged to contact the surface 11S of the base material 11. Color-filter-forming coloring layers 13R, 13G and 13B segments of any adjacent two of the pixels are extended to cover the first light-shielding layer 12$b$1 so that the coloring layer segments are arranged to have no gap therebetween. Moreover, the second light-shielding layer 12$b$2 is arranged at a surface side of the extended coloring layers 13R, 13G and 13B segments in the respective colors that is not the base material-11 side of these coloring layers.

In this example, a surface 12$b$S of the second light-shielding layer 12$b$2 of the pixel-dividing light-shielding region 18, this surface 12$b$3 being a surface farthest from the surface 11S of the base material 11, is positioned farther from the surface 11S of the base material 11 than respective surfaces of the color-filter-forming coloring layers 13R, 13G and 13B in the respective colors, these surfaces not being respective base material-11 side surfaces of the coloring layers, are positioned.

In the case of using the color filter forming substrate 10$b$ of the third example in an organic EL display device of a white-light-emitting type or a different-color-separately-painted type, this substrate 10$b$ is made into a form as described above, thereby making it possible to cut a light ray corresponding to the light ray L12 in the conventional organic EL display device illustrated in FIG. 7A, that is, a light ray existing by a matter that light emitted from the organic EL element of some pixel of the pixels has directly entered the coloring layer in a region of a pixel adjacent to the pixel. Moreover, this form makes it possible to cut almost entire light ray corresponding to the light ray L13 in the conventional organic EL display device illustrated in FIG. 7A, that is, a light ray existing by a matter that light emitted from the organic EL element of some pixel of the pixels has passed through the coloring layer of a region of this pixel and then entered the coloring layer in a region of a pixel adjacent to the pixel. These matters make it possible to prevent the generation of color shift or color mixing in the image displayed, the generation being caused by such light rays and being dependent on the direction in which the image is viewed.

The color filter forming substrate 10$b$ of the third example is also applied to an organic EL display device for any one of mobile electronic instruments, such as notebook computers as mobile models, and multifunctional terminal instruments (also referred to as high-functioning terminal instruments). However, the usage thereof is not limited to these examples.

Each of the members of the color filter forming substrate and the organic EL display device may be the same as in the first example.

In the third example, the segments of the color-filter-forming coloring layers in the respective colors are arranged to have no gap therebetween. As illustrated in, for example, FIG. 12D, ends of any adjacent two out of segments of color-filter-forming coloring layers 13R and 13G, and a color-filter-forming coloring layer 13B (not illustrated) may be formed to overlap each other in a pixel-dividing light-shielding region when the ends are viewed in plan.

4. Fourth Example of Embodiment of Color Filter Forming Substrate of the Invention The following will describe a fourth example of the embodiment of the color filter forming substrate of the present invention.

Figure 4A:
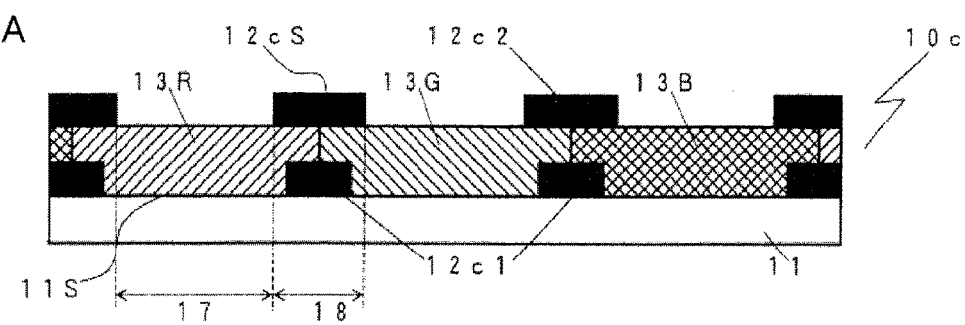
FIG. 4A is a partial sectional view of a fourth example of the embodiment of the color filter forming substrate of the present invention.

As illustrated in FIG. 4A, a color filter forming substrate 10$c$ of the fourth example is a substrate obtained by the following: in the color filter forming substrate 10$b$ of the third example, which has been illustrated in FIG. 3A, in particular, the line width of the second light-shielding layer 12$b$2 is made larger than that of the first light-shielding layer 12$b$1. Except this matter, the fourth example is identical with the third example.

In this example, the line width of a second light-shielding layer 12$c$2 is larger than that of a first light-shielding layer 12$c$1.

This form makes it possible to cut a light ray corresponding to the light ray L12 in the conventional organic EL display device illustrated in FIG. 7A, that is, a light ray existing by a matter that light emitted from the organic EL element of some pixel of the pixels has directly entered the coloring layer in a region of a pixel adjacent to the pixel. Moreover, this form makes it possible to cut almost entire light ray corresponding to the light ray L13 in the conventional organic EL display device illustrated in FIG. 7A, that is, a light ray existing by a matter that light emitted from the organic EL element of some pixel of the pixels has passed through the coloring layer of a region of this pixel and then entered the coloring layer in a region of a pixel adjacent to the pixel. These matters make it possible to prevent the generation of color shift or color mixing in the image displayed, the generation being caused by such light rays and being dependent on the direction in which the image is viewed.

The color filter forming substrate 10$c$ of the fourth example is also applied to an organic EL display device for any one of mobile electronic instruments, such as notebook computers as mobile models, and multifunctional terminal instruments (also referred to as high-functioning terminal instruments). However, the usage thereof is not limited to these examples.

Each of the members of the color filter forming substrate and the organic EL display device may be the same as in the first example.

5. Fifth Example of Embodiment of Color Filter Forming Substrate of the Invention The following will describe a fifth example of the embodiment of the color filter forming substrate of the present invention.

Figure 5A:
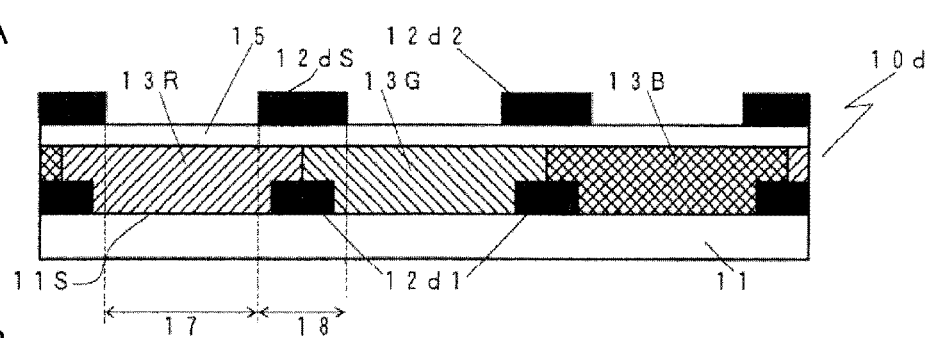
FIG. 5A is a partial sectional view of a fifth example of the embodiment of the color filter forming substrate of the present invention.

A color filter forming substrate 10$d$ of the fifth example illustrated in FIG. 5A is a substrate obtained by arranging a light absorbing layer 15 between the coloring layers 13R, 13G and 13B in the respective colors, and the second light-shielding layer 12$c$2 in the color filter forming substrate 10$c$ of the fourth example, which has been illustrated in FIG. 4A. The light absorbing layer 15 is arranged to cover the whole of the coloring layers 13R, 13G and 13B in the respective colors.

In this example, the light absorbing layer 15 is arranged between coloring layers 13R, 13G and 13B in the respective colors, and a second light-shielding layer 12$d$2.

As illustrated in FIG. 5A, in this example also, the line width of the second light-shielding layer 12$d$2 is larger than that of a first light-shielding layer 12$d$1. Except these matters, this example is identical with the fourth example.

In the same manner as in the fourth example, in this example also, this form makes it possible to cut a light ray corresponding to the light ray L12 in the conventional organic EL display device illustrated in FIG. 7A, that is, a light ray existing by a matter that light emitted from the organic EL element of some pixel of the pixels has directly entered the coloring layer in a region of a pixel adjacent to the pixel. Moreover, this form makes it possible to cut almost entire light ray corresponding to the light ray L13 in the conventional organic EL display device illustrated in FIG. 7A, that is, a light ray existing by a matter that light emitted from the organic EL element of some pixel of the pixels has passed through the coloring layer of a region of this pixel and then entered the coloring layer in a region of a pixel adjacent to the pixel. These matters make it possible to prevent the generation of color shift or color mixing in the image displayed, the generation being caused by such light rays and being dependent on the direction in which the image is viewed.

The color filter forming substrate 10d of the fifth example is also applied to an organic EL display device for any one of mobile electronic instruments, such as notebook computers as mobile models, and multifunctional terminal instruments (also referred to as high-functioning terminal instruments). However, the usage thereof is not limited to these examples.

<Light Absorbing Layer 15>

The material that forms the light absorbing layer 15 may be a material including a resin in which carbon black as a colorant and a blue pigment or some other for color adjustment are contained being dispersed. The resin may be a resin obtained by excluding the colorant from, for example, the resin composition for forming any one of the light-shielding layer 12 in the pixel-dividing light-shielding region, and the coloring layers 13R, 13G and 13B. The resin is painted into a film.

Examples of the method for the painting include photolithography (die coating or spin coating), and ink-jetting. Usually, the painting is attained by photolithography.

The light absorbing layer 15 preferably has a film thickness of 0.3 μm or more from the viewpoint of painted-film performance, and a decrease in the reflection of external light thereon.

The adjustment of the concentration of the primary colorant makes it possible to adjust the intensity of light transmitting the light absorbing layer. Moreover, an appropriate incorporation of the pigment for color adjustment makes it possible to give easily such a flat transmission property that the light transmittance of the light absorbing layer is rarely varied over the whole of the visible light band (range of wavelengths from 400 nm to 700 nm) when an image is displayed.

Figure 10:
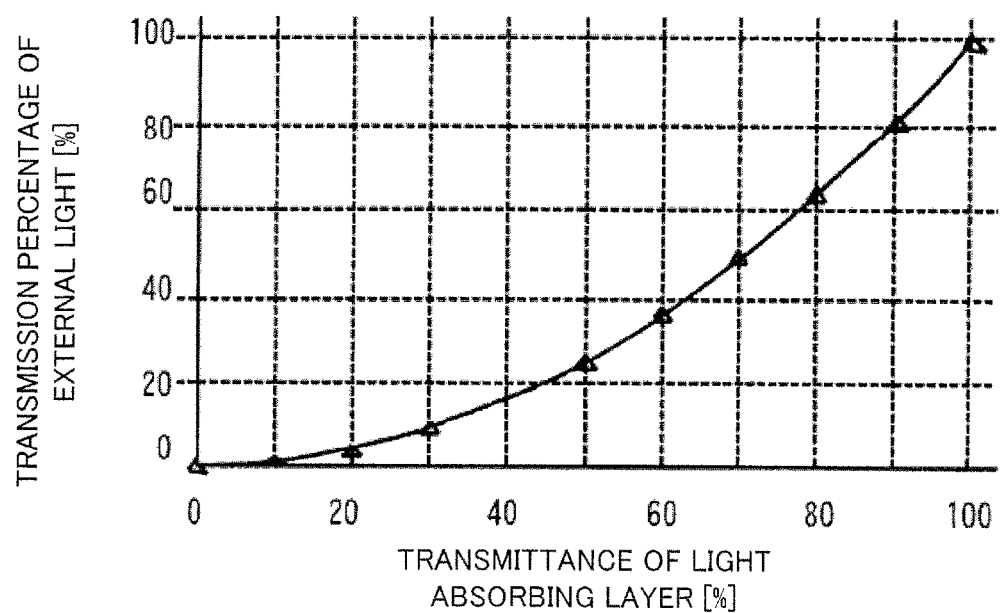
FIG. 10 is a graph showing a relationship between the transmittance of a light absorbing layer, and the the transmission of external light that has passed through the light absorbing layer twice.

The adjustment of the concentration of carbon black as the primary colorant makes it possible to give various transmittances easily, as shown in FIG. 10.

In FIG. 10, its transverse axis represents values of the transmittance of a light absorbing layer, and its vertical axis represents the percentage of the transmission of light when the light has passed, two times, through a light absorbing layer corresponding to any transmittance value of the former light absorbing layer. Each triangular symbol in FIG. 10 shows the transmittance (the transverse axis) of the light absorbing layer, which was measured in the state that the concentration of carbon black therein was adjusted, and the percentage (the vertical axis) of the transmission of light when the light had passed through the corresponding light absorbing layer two times.

Furthermore, the adjustment of the content by percentage of the pigment for color adjustment makes it possible to give easily a substantially flat transmission property over the visible light band (wavelength range from 400 nm to 700 nm).

As the light absorbing layer has a flatter light transmission property over the visible light band (wavelength range from 400 nm to 700 nm), color shift therein based on laying the light absorbing layer is smaller so that color shift of the transmitted light and color shift of the reflection of external light can be made smaller when an image is displayed.

Figure 9:
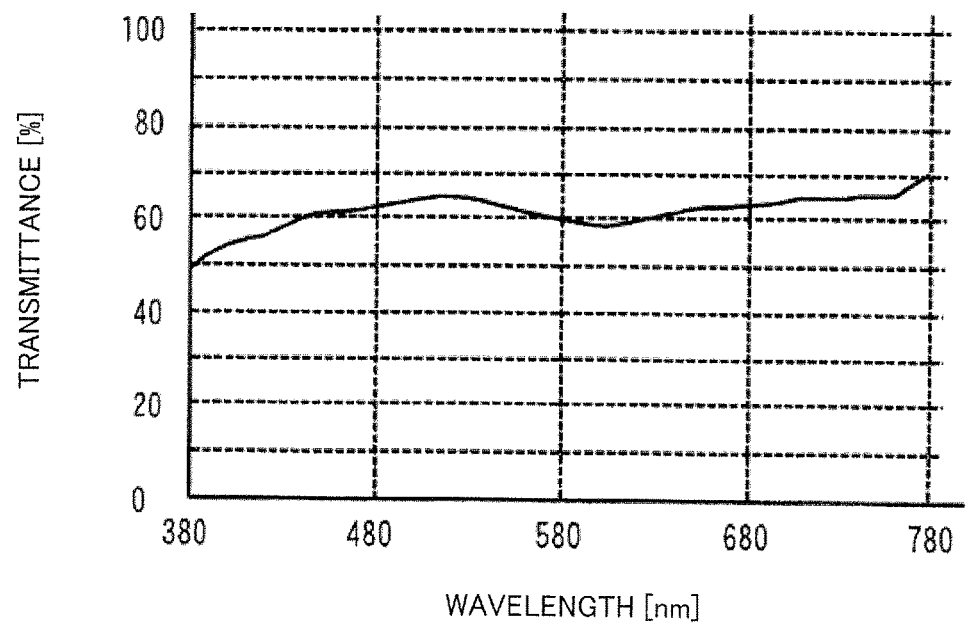
FIG. 9 is a graph showing a spectral transmittance property of a light absorbing layer.

In the case of using, for example, the light absorbing layer having the substantially flat transmission property shown in FIG. 9, a problem of color shift is not caused by laying the light absorbing layer.

When the transmission property of the light absorbing layer 15 is made flat and set to, for example, 60% in the visible light band (wavelength range from 400 nm to 700 nm), the quantity of light that has passed through the light absorbing layer 15 two times is decreased into approximately 36%, which is 60% of 60%.

Light when an image is displayed is radiated from the light absorbing layer 15 after the light passes through the light absorbing layer 15 one time. Thus, the decrease frequency of the quantity of the light transmitted through the light absorbing layer 15 is only one time. When the transmittance of the light absorbing layer 15 is set to, for example, 60%, the decrease in the quantity of the transmitted light passed through the light absorbing layer 15 one time is approximately 60%.

Figure 11A:
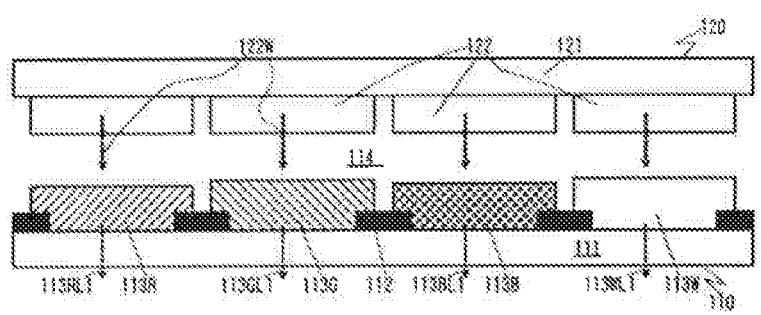
FIG. 11A is a partial sectional view of an organic EL display device in which a conventional white layer is arranged.
Figure 11B:
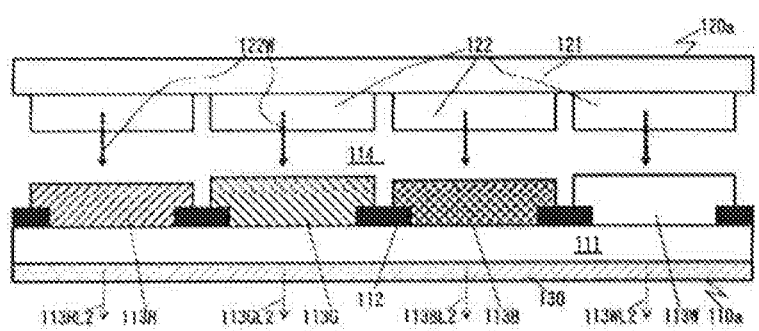
FIG. 11B is a partial sectional view of an organic EL display device in which a circularly polarizing plate is arranged on the front surface (observer side) of the display device illustrated in FIG. 11A.
Figure 11C:
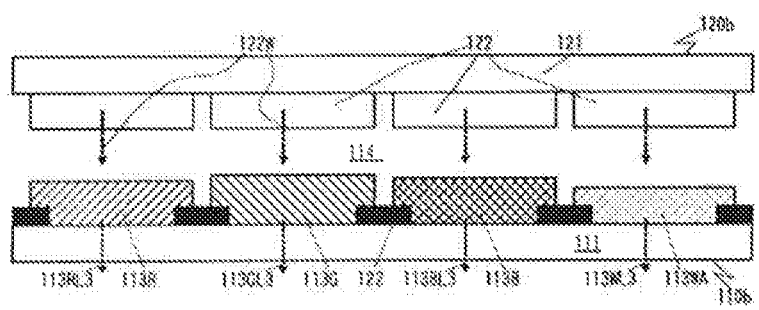
FIG. 11C is a partial sectional view of an organic EL display device in which transmittance adjusting portions are arranged in a conventional white-layer-formed region in the display device illustrated in FIG. 11A.

Accordingly, in the case of using the color filter forming substrate of the fifth example, the following is attained when the transmission property of the light absorbing layer 15 is a flat value of 60% in the visible ray range (wavelength range from 400 nm to 700 nm): the quantity of reflected light of external light which is obtained by a matter that the external light is made incident from the front surface (observer side) and then reflected on the inside electrodes or wiring to be radiated out can be decreased in 36% of that about the case of the organic EL display device that has been illustrated in FIG. 11A, so that the quantity of the transmitted light can be adjusted to 60% when an image is displayed; thus, about the transmitted light at the image-displaying time, the quantity of the light can be made larger than the quantity about the circularly-polarizing-plate-used organic EL display device that has been illustrated in FIG. 11B, which is about 40% of the quantity about the organic EL display device illustrated in FIG. 11A.

This example can be decreased, as compared with the organic EL display device illustrated in FIG. 11A, in quantity of reflected light of external light which is obtained by a matter that the external light is made incident from the front surface (observer side) and then reflected on the inside electrodes or wiring to be radiated out; and the example is further increased, as compared with the circularly-polarizing-plate-used organic EL display device illustrated in FIG. 11B, in quantity of the transmitted light when an image is displayed. Accordingly, in the case of a C light source, the average transmittance of the light absorbing layer 15 is preferably from 45% to 95%.

As described above, the transmittance of the light absorbing layer is substantially flat over the whole of the visible light band; thus, the "average transmittance" referred to herein is a value obtained by averaging the transmittances over the whole of the visible light band.

In a case where the light transmittance of the light absorbing layer is rarely varied to be flat, in particular, over the whole of the visible light band (wavelength range from 400 nm to 700 nm) when an image is displayed, color shift caused by laying the light absorbing layer can be decreased at the image-displaying time.

6. Sixth Example of Embodiment of Color Filter Forming Substrate of the Invention The following will describe a sixth example of the embodiment of the color filter forming substrate of the present invention.

Figure 14A:
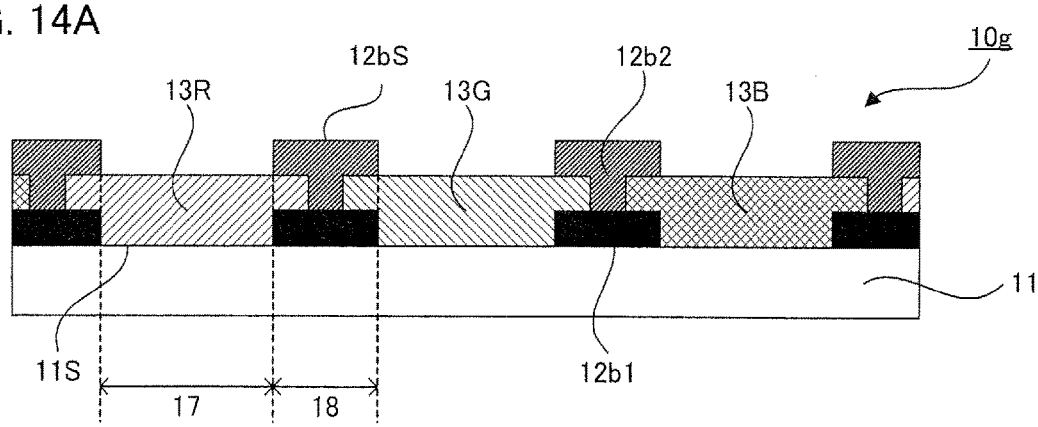

As illustrated in FIG. 14A, in a color filter forming substrate 10g of the sixth example, segments of coloring layers 13R, 13G and 13B in the respective colors are arranged to have gaps therebetween, and a first light-shielding layer 12b1 and a second light-shielding layer 12b2 are formed to contact each other through the gaps. Except this matter, the present example is identical with the third example.

The case of this form makes it possible to cut a light ray corresponding to the light ray L12 in the conventional organic EL display device illustrated in FIG. 7A, that is, a light ray existing by a matter that light emitted from the organic EL element of some pixel of the pixels has directly entered the coloring layer in a region of a pixel adjacent to the pixel. Moreover, this case makes it possible to cut light ray corresponding to the light ray L13 in the conventional organic EL display device illustrated in FIG. 7A, that is, a light ray existing by a matter that light emitted from the organic EL element of some pixel of the pixels has passed through the coloring layer of a region of this pixel and then entered the coloring layer in a region of a pixel adjacent to the pixel. In particular, by the formation of the first and second light-shielding layers to contact each other, the present example makes it possible to cut a larger quantity of the light ray corresponding to the light ray L13 represented in FIG. 7A by effect of the first and second light-shielding layers than the third example. Accordingly, this example makes it possible that color shift or color mixing in the image displayed is not generated, this inconvenience resulting from such light rays and being dependent on the direction in which the image is viewed.

The usage of the color filter forming substrate of the sixth example is equivalent to that of the first to fifth examples.

Each of the members of the color filter forming substrate and the organic EL display device may be the same as in the first example.

Figure 14B:
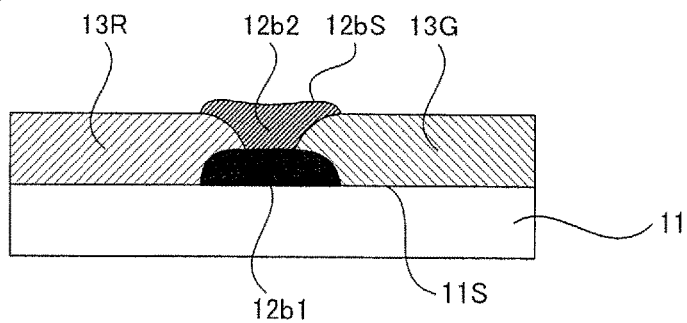
Figure 15:
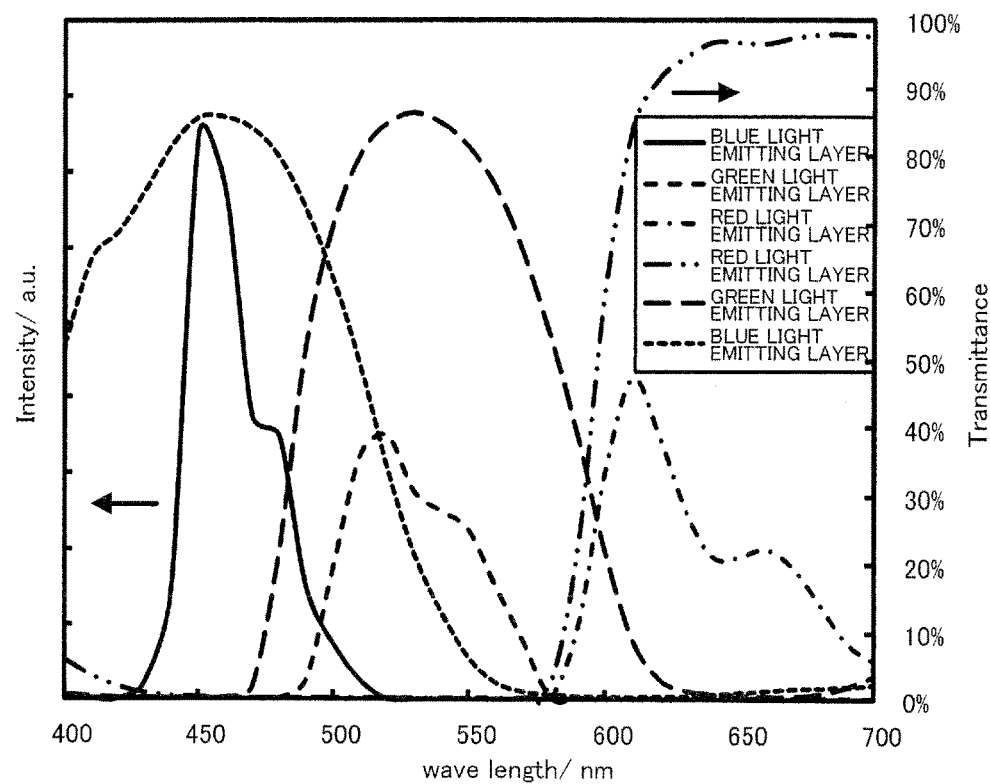
FIG. 15 is a graph showing an example of emission spectra of an organic EL element, and transmittance spectra of a color filter.

In the sixth example, a sectional structure of the color filter forming substrate may be a structure as illustrated in FIG. 14B.

The width of the gap between any adjacent two out of segments of the coloring layers is not particularly limited as far as the width is smaller than the line width of the first light-shielding layer and permits the first and second light-shielding layers to contact each other.

In the present example, it is sufficient for the first and second light-shielding layers to cut light rays corresponding to the light rays L12 and L13 represented in FIG. 7A. The line width of the first light-shielding layer may be equal to, or smaller or larger than that of the second light-shielding layer.

In order to form the first and second light-shielding layers to contact each other, it is advisable, for example, to form the segments of the coloring layers in the respective colors to have gaps therebetween, and form the second light-shielding layer to be embedded in the gaps.

7. Other Embodiments of Color Filter Forming Substrate of the Invention

The color filter forming substrate of the present invention is not limited into the above-mentioned embodiment.

For example, in each of the third to sixth examples, the second light-shielding layer 12b2, 12c2 or 12d2 may be substituted with a resin composition layer containing a blue colorant.

When light passes, in this embodiment, through the respective coloring layers in the pixels, the resin composition layer containing the blue colorant effectively absorbs the light because of the transmission property thereof to make it possible to restrain effectively color shift or color mixing in the image displayed, this inconvenience being caused by a light ray corresponding to the light ray L12 represented in FIG. 7A.

When the resin composition layer containing the blue colorant is made of the same resin composition as used for the color-filter-forming blue coloring layer, the color-filter-forming blue coloring layer and the resin composition layer containing the blue colorant can be production.

Figure 2B:
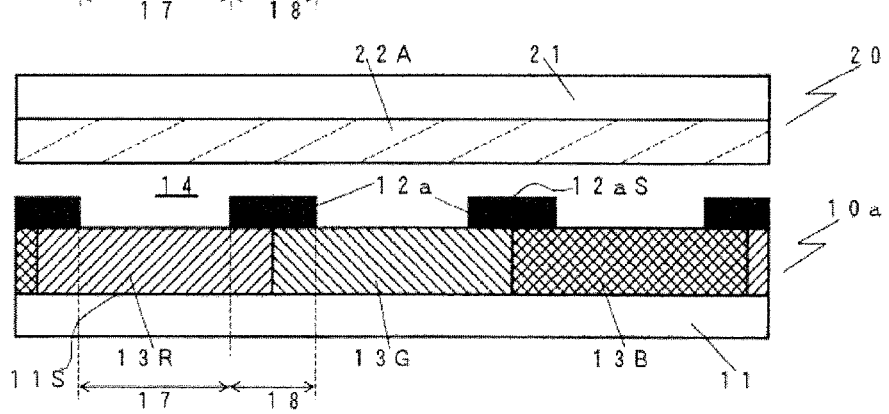
FIG. 2B is a partial sectional view of an organic EL display device using the color filter forming substrate of the second example illustrated in FIG. 2A.

A modified example of the second example is an embodiment in which a protective layer 15 is laid which covers the color-filter-forming coloring layers 13R, 13G and 13B in the respective colors, and a light-shielding layer (corresponding to the light-shielding layer 12a in FIGS. 2) is formed on a surface of the protective layer 15 that is not the base material-11 side surface of the protective layer 15.

In this embodiment, it is expected that by the laying of the protective layer 15, planarization is achieved and the underlay of the protective layer 15 is stabilized. Thus, the formation of the light-shielding layer is certainly made easy. When the protective layer 15 is made of an inorganic composition, this layer can further ensure an optical property, and the layer can be stabilized as an underlay when the light-shielding layer is formed.

Of course, in the same manner as in the second example, when this modified example is used for an organic EL display device of a white-light-emitting type or a different-color-separately-painted type, it is possible to cut a light ray corresponding to the light ray L12 in the conventional organic EL display device illustrated in FIG. 7A, that is, a light ray existing by a matter that light emitted from the organic EL element of some pixel of the pixels has directly entered the coloring layer in a region of a pixel adjacent to the pixel. The cutting makes it possible that color shift or color mixing in the image displayed is not generated, this inconvenience being caused by such a light ray and being dependent on the direction in which the image is viewed.

Figure 3B:
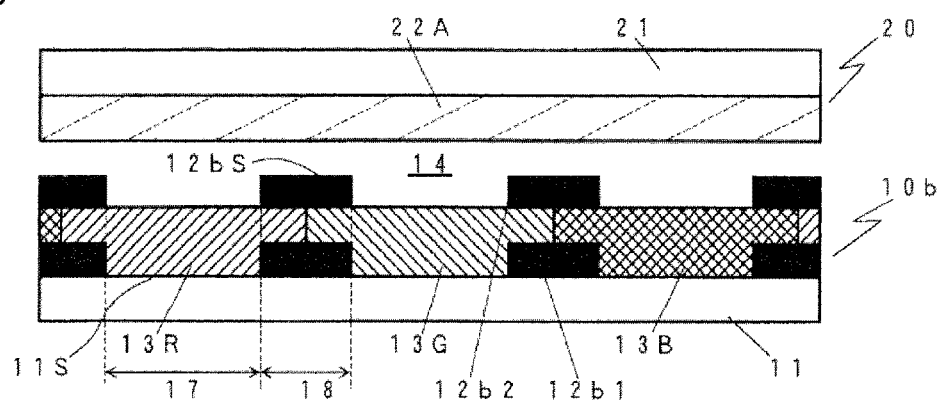
FIG. 3B is a partial sectional view of an organic EL display device using the color filter forming substrate of the third example illustrated in FIG. 3A.
Figure 4B:
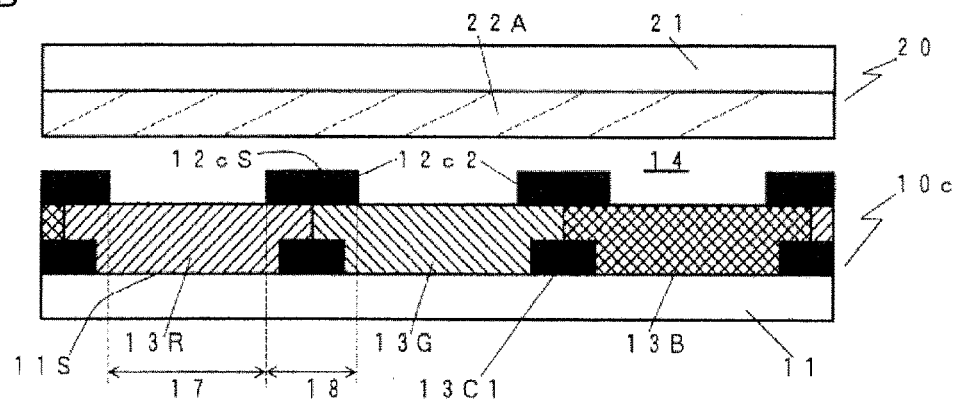
FIG. 4B is a partial sectional view of an organic EL display device using the color filter forming substrate of the fourth example illustrated in FIG. 4A.
Figure 5B:
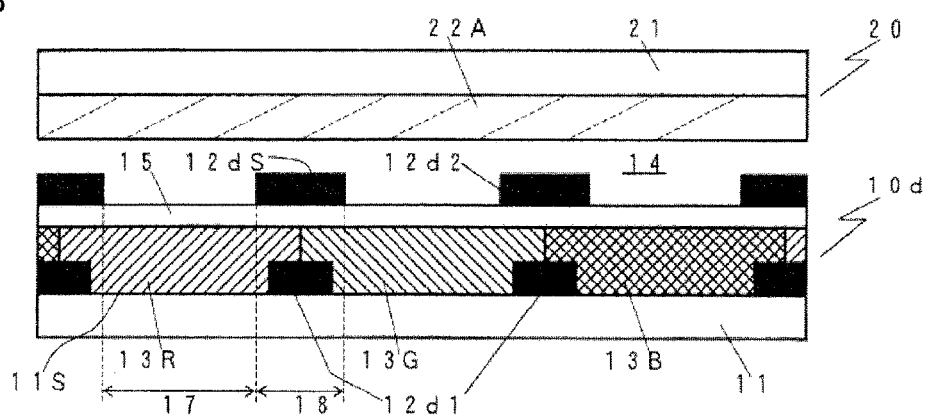
FIG. 5B is a partial sectional view of an organic EL display device using the color filter forming substrate of the fifth example illustrated in FIG. 5A.

In the same manner, respective modified examples of the third to fifth examples are each an embodiment in which a protective layer 15 is laid which covers the color-filter-forming coloring layers 13R, 13G and 13B in the respective colors, and a second light-shielding layer (corresponding to the second light-shielding layer 12b2 in FIGS. 3, the second light-shielding layer 12c2 in FIGS. 4 or the second light-shielding layer 12d2 in FIGS. 5) is formed on a surface of the protective layer 15 that is not the base material-11 side surface of the protective layer 15.

In the embodiment, it is expected that by the laying of the protective layer 15, planarization is achieved and the underlay of the protective layer 15 is stabilized. Thus, the formation of the second light-shielding layer is certainly made easy. When the protective layer 15 is made of an inorganic composition, this layer can further ensure an optical property, and the layer can be stabilized as an underlay when the second light-shielding layer is formed.

Of course, in the embodiment also, when the modified example is used for an organic EL display device of a white-light-emitting type or a different-color-separately-painted type, it is possible to cut a light ray corresponding to the light ray L12 in the conventional organic EL display device illustrated in FIG. 7A, that is, a light ray existing by a matter that light emitted from the organic EL element of some pixel of the pixels has directly entered the coloring layer in a region of a pixel adjacent to the pixel. Moreover, this form makes it possible to cut almost entire light ray corresponding to the light ray L13 in the conventional organic EL display device illustrated in FIG. 7A, that is, a light ray existing by a matter that light emitted from the organic EL element of some pixel of the pixels has passed through the coloring layer of a region of this pixel and then entered the coloring layer in a region of a pixel adjacent to the pixel. These matters make it possible that color shift or color mixing in the image displayed is not generated, this inconvenience being caused by such a light ray and being dependent on the direction in which the image is viewed.

A further modified example is an embodiment illustrated in each of FIG. 63 and FIG. 60, in which a light absorbing layer 15 is arranged below the coloring layers 13R, 13G and 13B (at the base material-11 side of the layers) in the color filter forming substrate 10 of the first example.

An additional modified example is an embodiment in which the following is attained in an embodiment-example in which coloring layers are arranged as outermost layers, or an embodiment-example in which a light absorbing layer is arranged as an outermost layer: a layer having a scattering function (also referred to as a scattering layer) is further formed on the coloring layers, or on the light absorbing layer.

The case where the scattering layer is laid makes it possible to improve the parallax in accordance with observer's viewing direction as compared with a case where no scattering layer is laid.

In each of the second to fourth examples, in all adjacent twos of the pixels, the segments of the color-filter-forming coloring layers in the respective colors have no gap therebetween. However, gaps may be present therebetween.

8. Method for Producing Color Filter Forming Substrate of the Invention

The following will briefly describe examples of a method for producing the color filter forming substrate of the present invention.

An example is initially given about a method for producing the color filter forming substrate 10 of the first example illustrated in FIG. 1A.

A transparent base material 11 is beforehand prepared, an a light shielding layer 12 of a pixel-dividing light-shielding region 18 is formed on one surface of the base material 11 by an ordinary photolithography. Next, color-filter-forming coloring layers 13R, 13G and 13B in the respective colors, and a white layer 13W are successively formed into respective predetermined forming-regions by an ordinary photolithography.

Usually, the light-shielding layer 12 of the pixel-dividing light-shielding region 18, and the color-filter-forming coloring layers 13R, 13G and 13B in the respective colors are each formed by a photolitho method (also referred to as photolithography method), using a colored-portion-forming resin composition in which a colorant, such as a pigment or dye, in the corresponding color is dispersed or dissolved in a binder. However, the method for the formation is not limited to this method. The formation may be according to a printing or ink-jetting method.

When the substrate 10 has white pixels, a white layer is further formed by photolithography using a resin having a composition obtained by excluding the colorant (coloring material) from any one of the respective resin compositions for forming the light-shielding layer 12 of the pixel-dividing light-shielding region 18, and for forming the coloring layers 13R, 13G and 13B, or from some other. However, the method for the formation is not limited to this method. The formation may be according to a printing Or ink-jetting method.

A method for producing the color filter forming substrate 10a of the second example illustrated in FIG. 2A is a method in which, in the method for producing the color filter forming substrate 10 of the first example, the formation of the light-shielding layer 12a of the pixel-dividing light-shielding region 18, and that of the coloring layers 13R, 13G and 13B in the respective colors are performed in a changed formation-turn. The method for forming each of the layers is the same as used in the case of the method for producing the color filter forming substrate 10 of the first example.

In a method for producing the color filter forming substrate 10b of the third example illustrated in FIG. 3A, the light-shielding layers (first and second light-shielding layers 12b1 and 12b2) are formed, respectively, before and after the formation of the coloring layers 13R, 13G and 13B in the respective colors. The method for forming each of the layers is the same as used in the case of the method for producing the color filter forming substrate 10 of the first example.

A method for producing the color filter forming substrate 10c of the fourth example illustrated in FIG. 4A is basically equal to the method for producing the third color filter forming substrate 10b.

A method for producing the color filter forming substrate 10g of the sixth example illustrated in FIG. 14A is basically equivalent to the method for producing the third color filter forming substrate 10b; and the segments of the coloring layers 13R, 13G and 13B in the respective colors are formed to have gaps therebetween. The second light-shielding layer 12b2 is formed to be embedded into the gaps.

A method for producing the color filter forming substrate 10d of the fifth example illustrated in FIG. 5A is basically equivalent to the method for producing the third color filter forming substrate 10b; and after the formation of the coloring layers 13R, 13G and 13B in the respective colors, a step is increased in which the light absorbing layer 15 is formed. The formation of the light absorbing layer can be attained by, for example, a panting method.

Figure 6A:
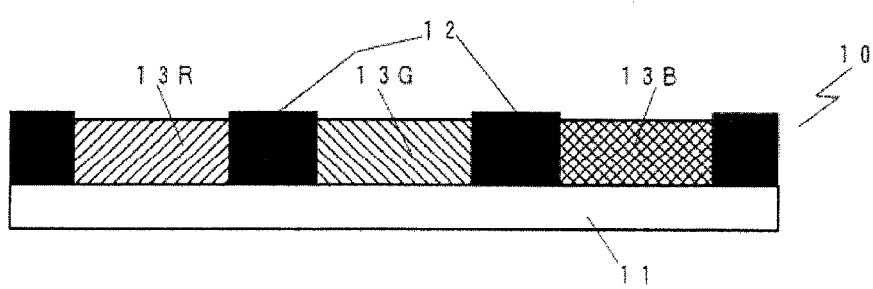
FIG. 6A is a partial sectional view of the color filter forming substrate of the first example illustrated in FIG. 1A, and FIGS. 6B and 6C are each a partial sectional view illustrating a modified example of the color filter forming substrate of the first example.
Figure 6B:
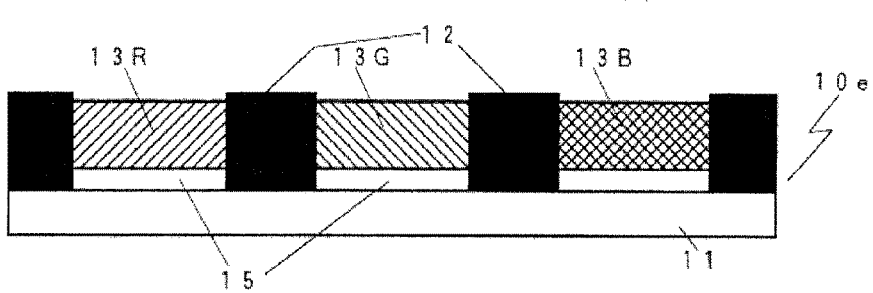

In the case of producing the color filter forming substrate 10e in the form illustrated in FIG. 6B, a step is increased in which the light absorbing layer 15 is formed before the formation of the coloring layers 13R, 13G and 13B in the respective colors in the method for producing the color filter forming substrate 10 of the first example. The formation of the light absorbing layer can be attained by, for example, a photolithography method or ink-jetting method.

Figure 6C:
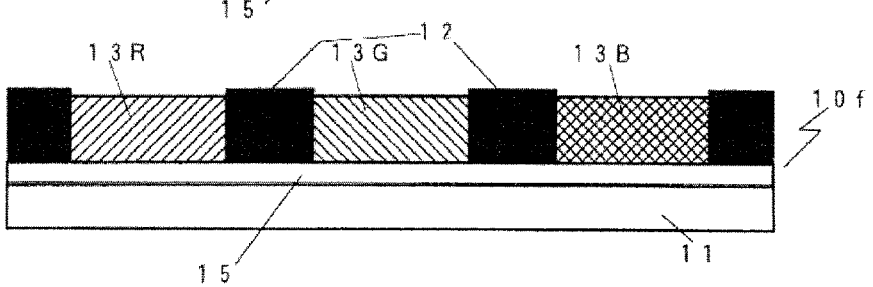

In the case of producing the color filter forming substrate 10f in the form illustrated in FIG. 6C, a light absorbing layer 15 is formed before the formation of a light-shielding layer 12 in the method for producing the color filter forming substrate 10 of the first example. The formation of the light absorbing layer can be attained by, for example, a panting method.

Incidentally, the present invention is not limited to the above-mentioned embodiments. The embodiments show merely examples. Any embodiment is included in the technical scope of the present invention as far as the embodiment has substantially the same subject matter as based on the technical conception recited in the claims of the present invention and produces substantially the same advantageous effects as produced thereby.

EXAMPLES

The present invention will be described in more detailed by way of working examples demonstrated below.

Example 1

A color filter forming substrate as illustrated as in FIG. 1A was produced.

As will be detailed below, a photo-curing curable resin composition A was initially prepared. This curable resin composition A was used to prepare a red curable resin composition, a green curable resin composition and a blue curable resin composition for colored-layer-formation, and a curable resin composition for light-shielding-layer-formation. Next, these compositions were used, and a photolithography was performed about each of the curable resin compositions. In this way, coloring layers in the respective colors, and a light-shielding layer were formed.

In this example, after the formation of the light-shielding layer 12, the red coloring layer 13R, the green coloring layer 13G and the blue coloring layer 13B were each formed through a step for the photolithograph.

(Preparation of the Curable Resin Composition A)

Into a polymerizing tank were charged 63 parts by weight of methyl methacrylate (MMA), 12 parts by weight of acrylic acid (AA), 6 parts by weight of 2-hydroxyethyl methacrylate (HEMA) and 88 parts by weight of diethylene glycol dimethyl ether (DMDG), followed by stirring to dissolve them, and then thereto were added 7 parts by weight of 2,2'-azobis(2-methylbutyronitrile) to dissolve this compound evenly. Thereafter, under a nitrogen gas flow, the reaction system was stirred at 85° C. for 2 hours. The reactive components were further caused to react with each other at 100° C. for 1 hour. To the resultant solution were further added 7 parts by weight of glycidyl methacrylate (GMA), 0.4 part by weight of triethylamine, and 0.2 part by weight of hydroquinone. The reaction system was stirred at 100° C. for 5 hours to yield a copolymer resin solution (solid content by percentage: 50%).

Next, materials described below were stirred at room temperature to be mixed with each other to yield the curable resin composition A referred to above.

<Composition of the Curable Resin Composition A>
The above-mentioned copolymer resin solution (solid content by percentage: 50%): 16 parts by weight;
Dipentaerythritol pentaacrylate (SR 399™, manufactured by Sartomer Company Inc): 24 parts by weight;
Ortho-cresol novolak type epoxy resin (EPICOAT 180S70™, manufactured by Yuka Shell Epoxy K.K. (current Japan Epoxy Resins Co., Ltd.)): 4 parts by weight;
2-Methyl-1-(4-methylthiophenyl)-2-morpholinopropane-1-one: 4 parts by weight; and
Diethylene glycol dimethyl ether: 52 parts by weight.

(Light-Shielding Layer Formation)

As will be detailed below, the curable resin composition for light-shielding-layer-formation was used to form the light-shielding layer referred to above into a film thickness of 2.7 μm onto a glass substrate (AN material, manufactured by Asahi Glass Co., Ltd.) by photolithography.

<Preparation of the Curable Resin Composition for Light-Shielding-Layer-Formation>

Components described below were mixed with each other in respective amounts described below. A bead mill was used to disperse the colorant sufficiently to prepare a black pigment dispersed liquid B.

<Composition of the Black Pigment Dispersed Liquid B>
Resin-coated carbon black (MS18E™, manufactured by Mitsubishi Chemical Corp.): 20 parts by weight;
Polymeric dispersing agent (DISPERBYK 163™, manufactured by BYK Japan K.K.): 5 parts by weight; and
Solvent (diethylene glycol dimethyl ether): 75 parts by weight.

The resin-coated carbon black (MS18E™, manufactured by Mitsubishi Chemical Corp.) had an average particle diameter of 25 nm. Incidentally, the particle diameter was obtained by diluting the colorant with the same solvent as that contained in the composition (called a diluting solvent), and measuring the value of the 50% average particle diameter thereof, which was the particle diameter at which the accumulation of the particle diameters of the pigment in the composition occupied 50%, using a laser Doppler scattered light diffraction particle size analyzer (trade name: "Microtrac 934UPA") manufactured by NIKKISO CO., LTD.

Next, components described below were sufficiently mixed with each other in respective amounts described below to yield the curable resin composition for light-shielding-layer-formation.

<Composition of the Curable Resin Composition for Light-Shielding-Layer-Formation>
The black pigment dispersed liquid B: 43 parts by weight;
The curable resin composition A: 19 parts by weight; and
Diethylene glycol dimethyl ether: 38 parts by weight.

The curable resin composition for light-shielding-layer-formation was painted onto a surface of the glass substrate with a spin coater, and the resultant was dried at 100° C. for 3 minutes to form a light-shielding resin layer. At a position having a distance of 100 μm from this light-shielding resin layer, a photomask was arranged to expose the light-shielding resin layer patternwise to light from a 2.0 kW super-high mercury lamp through a proximity aligner. Thereafter, the resultant was developed with a 0.05%-by-weight solution of potassium hydroxide in water. Thereafter, the substrate was allowed to stand still in an atmosphere of 230° C. temperature for 30 minutes to be thermally treated. In this way, the light-shielding layer was formed into a predetermined form.

(Coloring Layer Formation)

Next, the coloring layers in the respective colors, referred to above, were formed as follows:

(1) Red Coloring Layer Formation

A spin coating method was used to paint a red curable resin composition having a composition described below onto the substrate on which the light-shielding layer was patternwise formed, and then the workpiece was dried in an oven of 70° C. temperature for 3 minutes. Next, at a position having a distance of 100 μm from the painted film of the red curable resin composition, a photomask was arranged. Through a proximity aligner, a 2.0-kW super-high mercury lamp was used to radiate ultraviolet rays, for 10 seconds, onto only regions of the workpiece that corresponded to regions where the afore-mentioned red coloring layer was to be formed. Next, the workpiece was immersed in a 0.05%-by-weight solution of potassium hydroxide in water (liquid temperature: 23° C.) for 1 minute to be subjected to alkaline development, thereby removing only the uncured portions of the painted film of the red curable resin composition. Thereafter, the substrate was allowed to stand still in an atmosphere of 230° C. temperature for 15 minutes to be thermally treated. In this way, in its regions for display, the red coloring layer referred to above, which was in a pattern form, was formed. The thickness of the formed film was 2.0 μm.

<Composition of the Red Curable Resin Composition>
  C.I. pigment red 177: 3 parts by weight;
  C.I. pigment red 254: 4 parts by weight;
  Polysulfonic acid type polymeric dispersing agent: 3 parts by weight;
  Curable resin composition A: 23 parts by weight; and
  3-Methoxybutyl acetate: 67 parts by weight.
(2) Green Coloring Layer Formation Next, through the same steps as used to form the red coloring layer except that the thickness of the painted film was changed, a green curable resin composition having a composition described below was used to form the green coloring layer referred to above, which was in a pattern form, in the display regions to set the thickness of the formed film to 2.0 μm.

<Composition of the Green Curable Resin Composition>
  C.I. pigment green 58: 7 parts by weight;
  C.I. pigment yellow 138: 1 part by weight;
  Polysulfonic acid type polymeric dispersing agent: 3 parts by weight;
  Curable resin composition A: 22 parts by weight; and
  3-Methoxybutyl Acetate: 67 Parts by Weight.

(3) Blue Coloring Layer Formation

Next, through the same steps as used to form the red coloring layer except that the thickness of the painted film was changed, a blue curable resin composition having a composition described below was used to form the blue coloring layer referred to above, which was in a pattern form, in the display regions to set the thickness of the formed film to 2.0 μm.

<Composition of the Blue Curable Resin Composition>
  C.I. pigment blue 15:6: 4 parts by weight;
  C.I. pigment blue 23: 1 parts by weight;
  Polysulfonic acid type polymeric dispersing agent: 3 parts by weight;
  Curable resin composition A: 25 parts by weight; and
  3-Methoxybutyl acetate: 67 parts by weight.

Example 2

A color filter forming substrate as illustrated in FIG. 3A was produced.

The color filter forming substrate was produced in the same way as in Example 1 except that in Example 1 the film thickness of the light-shielding layer (also referred to as the first light-shielding layer) was changed to 1.5 μm, and a second light-shielding layer was formed on the coloring layers.

(Second Light-Shielding Layer Formation)

Through the same steps as used to form the red coloring layer except that the thickness of the painted film was changed, a curable resin composition described below for forming the second light-shielding layer was used to form the second light-shielding layer onto the substrate on which the coloring layers were formed, so as to set the thickness of the formed film to 1.0 μm.

<Preparation of the Curable Resin Composition for Forming the Second Light-Shielding Layer>

Initially, components described below were sufficiently each other in respective amounts described below in a bead mill to yield a black pigment dispersed liquid C.

<Composition of the Black Pigment Dispersed Liquid C>
  Resin-coated carbon black (MS18E™, manufactured by Mitsubishi Chemical Corp.): 20 parts by weight;
  Polymeric dispersing agent (DISPERBYK 163™, manufactured by BYK Japan K.K.): 5 parts by weight; and
  Solvent (diethylene glycol dimethyl ether): 75 parts by weight.

Next, components described below were sufficiently mixed with each other in respective amounts described below to yield the curable resin composition for forming the second light-shielding layer.

<Composition of the Curable Resin Composition for Forming the Second Light-Shielding Layer>
  Black pigment dispersed liquid C: 0.3 part by weight;
  Curable resin composition A: 19.7 parts by weight; and
  Diethylene glycol dimethyl ether: 80 parts by weight.

Example 3

A color filter forming substrate as illustrated in FIG. 14A was produced.

The color filter forming substrate was produced in the same way as in Example 2 except that in the formation of the coloring layers, the segments of the red, green and blue coloring layers were formed to have gaps therebetween.

Example 4

A color filter forming substrate was produced in the same way as in Example 2 except that the second light-shielding layer was formed by a method described below.

(Second Light-Shielding Layer Formation)

By sputtering, a silver-palladium-copper alloy (APC) thin film was formed into a film thickness of 1500 Å onto the substrate on which the coloring layers were formed. Thereafter, a positive type photoresist (S1818G™, manufactured by Rohm and Haas Electronic Materials LLC) was painted thereonto by spin coating, and then the workpiece was dried in an oven of 70° C. temperature for 3 minutes. Next, at a position having a distance of 100 μm from the painted film of the positive type photoresist, a photomask was arranged to expose, for 10 seconds, only a region corresponding to a region where the second light-shielding layer was not to be formed to ultraviolet rays from a 2.0 kW super-high mercury lamp through a proximity aligner. Next, the resultant was immersed in a 2.38%-by-weight solution of tetramethylammonium hydroxide in water (liquid temperature: 23° C.) for 1 minute to be subjected to alkaline development, thereby removing only the light-radiated portions of the painted film of the positive type photoresist. Thereafter, the workpiece was immersed into a solution of ammonium nitrate in water to remove only the naked portions of the APC thin film. A predetermined peeling solution was used to peel the positive type photoresist to yield a patterned APC thin film.

Comparative Example

A color filter forming substrate was formed in the same way as Example 2 except that the second light-shielding layer was not formed.

[Evaluation]

As illustrated in FIG. 1B, each of the produced color filter forming substrates 10 and an organic EL element forming substrate 20 were laminated with a predetermined interval to sandwich an insulating resin therebetween to produce an organic EL display device.

About the organic EL display device using the color filter forming substrate of each of Examples 1 to 4 and Comparative Example, the parallax thereof (color shift generated when its image was viewed from each of the front surface direction and an oblique direction) was evaluated. The parallax was estimated with the naked eye. In a case where the organic EL display device was viewed from the front and the oblique direction, this display device was ranked as "A" when no color shift was recognized. When color shift was recognized, the display device was ranked as "B".

As shown in Table 1, in Comparative Example, color shift was recognized when the organic EL display device was viewed from the front and the oblique direction. However, in each of Examples 1 to 4, no color shift was recognized when the organic EL display device was viewed from the front and the oblique direction.

TABLE 1

|  | Parallax evaluation |
|---|---|
| Example 1 | A |
| Example 2 | A |
| Example 3 | A |
| Example 4 | A |
| Comparative Example | B |

REFERENCE SIGNS LIST 10, and 10a to 10g: color filter forming substrate
11: base material (also referred to as transparent substrate)
11S: base material surface
12, 12a and 12A: light-shielding layer
12b1, 12c1, and 12d1: first light-shielding layer
12b2, 12c2, and 12d2: second light-shielding layer
12S and 12aS: surface (of light-shielding layer farthest from base material)
12bS, 12cS and 12dS: surface (of light-shielding layer farthest from base material)
13R: red coloring layer
13G: green coloring layer
13B: blue coloring layer
14: insulating resin layer
15: light absorbing layer
17: pixel region
17a to 17f: pixel region
18: pixel-dividing light-shielding region
20: organic EL element forming substrate
21: base material (also referred to as transparent substrate)
22 and 22A: organic EL element (also referred to as organic light emitting element or organic EL light emitting element)
25: anode
26: organic EL layer
27: light emitting layer
28: cathode
110, 110a and 110b: color filter forming substrate
111: base material (also referred to as transparent substrate)
112: black matrix
113R: red coloring layer
113G: green coloring layer
113B: blue coloring layer
113W: white layer
113WA: transmittance adjusting portion
113RL1, 113RL2, and 113RT3: red display color
113GL1, 113GL2, and 113GL3: green display color
113BL1, 113BL2, and 113BL3: blue display color
114: insulating resin layer
120, 120a and 120b: organic EL element forming substrate
121: base material (also referred to as transparent substrate)
122: organic EL element
122W: white light

The invention claimed is:

1. A color filter forming substrate for an organic EL display device, in which a pixel-dividing light-shielding region is arranged over one surface of a base material comprising a transparent substrate to make plural pixel regions into a region-divided form, and plural color-filter-forming coloring layers of multiple colors are arranged to a predetermined pixel region in accordance with a respective color, wherein
the color filter forming substrate is a counter substrate facing an organic EL element forming substrate comprising an organic EL element,
a light-shielding layer is arranged in the pixel-dividing light-shielding region; and a surface of the light-shielding layer being farthest from the one surface of the base material is positioned farther from the one surface of the base material than a surface of each of the color-filter-forming coloring layers which is on the side opposite to the base material side, and
wherein the light-shielding layer arranged in the pixel-dividing light-shielding region has two layers; a first light-shielding layer thereof is arranged to contact the one surface of the base material; segments of the color-filter-forming coloring layers in the respective colors of any adjacent ones out of pixels are each extended to cover the first light-shielding layer; a second light-shielding layer of the two layers is arranged at a surface side of the extended coloring layer segments in the respective colors; and the surface side of the extended coloring layer segments is opposite to the base material side.

2. The color filter forming substrate according to claim 1, wherein the second light-shielding layer is larger in line width than the first light-shielding layer.

3. The color filter forming substrate according to claim 1, wherein the second light-shielding layer is formed to contact a surface of a protective layer which covers the color-filter-forming coloring layers in the respective colors, and the surface of the protective layer is on the side opposite to the base material side.

4. The color filter forming substrate according to claim 3, wherein the protective layer comprises an inorganic composition.

5. The color filter forming substrate according to claim 1, wherein a light absorbing layer is formed on the pixel regions.

6. The color filter forming substrate according to claim 5, wherein, in the light absorbing layer, carbon black is contained being dispersed as a colorant in a resin.

7. The color filter forming substrate according to claim 5, wherein the light absorbing layer has an average transmittance of 45% to 95% to light emitted from a C illuminant.

8. An organic EL display device, having a structure in which an organic EL element forming substrate and a color filter forming substrate are laminated, wherein the color filter forming substrate as recited in claim 1 is used.

* * * * *